(12) United States Patent
Yao et al.

(10) Patent No.: US 11,029,355 B2
(45) Date of Patent: Jun. 8, 2021

(54) DIRECT MEASUREMENT TEST STRUCTURES FOR MEASURING STATIC RANDOM ACCESS MEMORY STATIC NOISE MARGIN

(71) Applicant: The Boeing Company, Chicago, IL (US)

(72) Inventors: Mark Yao, Irvine, CA (US); Manuel F. Cabanas-Holmen, Roy, WA (US); Ethan H. Cannon, Issaquah, WA (US)

(73) Assignee: THE BOEING COMPANY, Chicago, IL (US)

( * ) Notice: Subject to any disclaimer, the term of this patent is extended or adjusted under 35 U.S.C. 154(b) by 155 days.

(21) Appl. No.: 16/374,355

(22) Filed: Apr. 3, 2019

(65) Prior Publication Data

US 2020/0319243 A1 Oct. 8, 2020

(51) Int. Cl.
*G01R 29/26* (2006.01)
*G01R 31/26* (2020.01)
(Continued)

(52) U.S. Cl.
CPC ......... *G01R 31/2626* (2013.01); *G01R 23/20* (2013.01); *G01R 27/28* (2013.01);
(Continued)

(58) Field of Classification Search
CPC ........ G01R 29/26; G01R 23/20; G01R 27/28; G01R 31/2834; G01R 31/2626; G01R 31/275; H04B 17/20; H04B 17/336; H04B 3/46; H04B 17/21; G11C 7/24; G11C 11/418; G11C 11/419; G11C 11/413; G11C 11/417; G11C 29/24; G11C 29/54; G11C 2029/5004; G11C 2029/0403; G11C 2029/0401; G11C 2029/5602; G11C 2029/5604; G11C 29/50016;
(Continued)

(56) References Cited

U.S. PATENT DOCUMENTS 7,385,864 B2  6/2008  Loh et al.
9,297,850 B1  3/2016  Clark et al.
(Continued)

OTHER PUBLICATIONS

Extended European Search Report dated Jul. 27, 2020 in corresponding European Application No. 20153300.7, 9 pages.
(Continued)

*Primary Examiner* — Raul J Rios Russo
(74) *Attorney, Agent, or Firm* — MH2 Technology Law Group LLP

(57) ABSTRACT

A test structure for measuring static noise margin (SNM) for one or more static random access memory (SRAM) cells can include a first transistor gate (TG) and a second TG electrically coupled to each SRAM cell. In an implementation, an interconnect between an output of a first inverter and an input of a second inverter of the SRAM cell can be electrically disconnected using a cut off. During operation of the SRAM cell, internal storage nodes within the SRAM cell can be electrically coupled through the first TG and the second TG to, for example, external pins and to a test fixture. Electrical parameters such as voltage can be measured at the internal storage nodes through the external pins and used to calculate SNM of the SRAM cell.

22 Claims, 14 Drawing Sheets

(51) Int. Cl.
*G01R 31/27* (2006.01)
*G11C 7/24* (2006.01)
*G11C 11/418* (2006.01)
*G11C 11/419* (2006.01)
*H01L 27/11* (2006.01)
*G01R 23/20* (2006.01)
*G01R 27/28* (2006.01)
*G01R 31/28* (2006.01)
*H04B 17/20* (2015.01)
*H04B 17/336* (2015.01)
*H04B 3/46* (2015.01)
*H04B 17/21* (2015.01)

(52) U.S. Cl.
CPC ........... *G01R 29/26* (2013.01); *G01R 31/275* (2013.01); *G01R 31/2834* (2013.01); *G11C 7/24* (2013.01); *G11C 11/418* (2013.01); *G11C 11/419* (2013.01); *H01L 27/1104* (2013.01); *H04B 3/46* (2013.01); *H04B 17/20* (2015.01); *H04B 17/21* (2015.01); *H04B 17/336* (2015.01)

(58) Field of Classification Search
CPC ................ G11C 29/021; G11C 29/028; G11C 29/56008; G11C 29/006; G11C 29/48; G11C 29/04; H01L 27/1104
USPC ... 324/76.11–76.83, 459, 600, 612, 613, 614
See application file for complete search history.

(56) References Cited

U.S. PATENT DOCUMENTS

| | | | |
|---|---|---|---|
| 2002/0159312 A1 | 10/2002 | Kasai et al. | |
| 2002/0167849 A1* | 11/2002 | Ohbayashi | G11C 29/50 365/189.09 |
| 2007/0235765 A1* | 10/2007 | Liaw | H01L 27/11 257/207 |
| 2008/0062746 A1 | 3/2008 | Loh et al. | |
| 2008/0148116 A1 | 6/2008 | Deng et al. | |
| 2008/0251878 A1* | 10/2008 | Mandelman | H01L 27/1104 257/506 |
| 2009/0296497 A1 | 12/2009 | Hirabayashi et al. | |
| 2010/0014369 A1* | 1/2010 | Wielage | G11C 29/50 365/201 |
| 2013/0170275 A1* | 7/2013 | Kumar | H01L 27/1104 365/63 |
| 2016/0225413 A1* | 8/2016 | Liaw | G11C 5/06 |
| 2017/0301395 A1 | 10/2017 | Clark et al. | |
| 2018/0048311 A1 | 2/2018 | Thompson et al. | |

OTHER PUBLICATIONS

Stallcup et al., "Measuring Static Noise Margin of 65nm Node SRAMS using a 7-Positioner SEM Nanoprobing Technique," Zyvex Instruments, LLC, Technical Paper 2007.2, (2007) pp. 1-4.

Zheng et al., Read Static Noise Margin Decrease of 65-nm 6-T SRAM Cell Induced by Total Ionizing Dose, IEEE Transactions on Nuclear Science, vol. 65, No. 2, Feb. 2018, pp. 691-697.

Chellappa et al., "In-situ Characterization and Extraction of SRAM Variability," School of Electrical, Computer and Energy Engineering, Arizona State University, Tempe, AZ, 42.1, DAC '10, Jun. 13-18, 2010, pp. 711-716.

Yao et al., "The Impact of Total Ionizing Dose on Unhardened SRAM Cell Margins," IEEE Transactions on Nuclear Science, vol. 55, No. 6, Dec. 2008, pp. 3280-3287.

Seevinck et al., "Static-Noise Margin Analysis of MOS SRAM Cells," IEEE Journal of Solid-State Circuits, vol. SC-22, No. 5, Oct. 1987, 748-754.

\* cited by examiner

DIRECT MEASUREMENT TEST STRUCTURES FOR MEASURING STATIC RANDOM ACCESS MEMORY STATIC NOISE MARGIN

FIELD

The present disclosure relates generally to test structures and methods for measuring static random access memory (SRAM) static noise margin (SNM). More particularly, the present disclosure relates to direct measurement memory cell test structures suitable for directly measuring SNM of SRAM cells.

BACKGROUND

Static noise margin (SNM) is a measure of how well a static random access memory (SRAM) cell can maintain its binary state when the SRAM memory cell is perturbed or upset. In other words, SNM is the maximum value of static voltage noise that a SRAM cell can tolerate without changing state. The change in state may corrupt data stored in the SRAM cell.

Some traditional techniques for determining SNM of SRAM include simulating SRAM memory cells to estimate the voltage. However, these simulations may not be accurate for all possible operating conditions for the SRAM cells. Another traditional technique is to measure SNM indirectly or through probing points, which can be ineffective. Moreover, these current approaches do not allow measurement of SNM for large numbers of SRAM cells in a short time with an easy setup.

Accordingly, what is needed are improved direct measurement test structures and methods that measure and estimate the SNM of an SRAM cell, which address the issues of the conventional techniques, and that can be used to characterize SRAM SNM during reliability tests and in cryogenic conditions and radiation environments.

SUMMARY

It is to be understood that both the foregoing general description and the following detailed description are exemplary and explanatory only and are not restrictive of the present teachings, as claimed.

In an implementation of the present teachings, a test structure for directly measuring a stability of one or more static random access memory (SRAM) cells in an Integrated Circuit (IC) device includes, for each SRAM cell of the one or more SRAM cells, a first transmission gate (TG) electrically coupled to a first side of a cut off in the SRAM cell, a second TG electrically coupled to a second side of the cut off, a first external pin electrically coupled to the first TG and a second external pin electrically coupled to the second TG, and a first internal node electrically coupled to the first TG and a second internal node electrically coupled to the second TG. Feedback between the first internal node and the second internal node is broken at the cut off, and the first internal node is electrically coupled to the first external pin and the second internal node is electrically coupled to the second external pin.

In another implementation, a method for measuring a stability of a static random access memory (SRAM) cell in an integrated circuit (IC) includes measuring a voltage transfer curve from a first side of a test structure, wherein the first side of the test structure is electrically coupled to a first internal node of the SRAM cell on a first side of a cut off via a first transmission gate (TG), obtaining a butterfly curve by plotting a curve that is substantially symmetrical to the measured voltage transfer curve, and determining a static noise margin (SNM) for each of the one or more SRAM cells by measuring an area bounded by the butterfly curve. Feedback between the first internal node and a second internal node is broken at the cut off. The first internal node is electrically coupled to a first external pin through the first TG, and the second internal node is electrically coupled to a second external pin through a second TG.

In another implementation, an array of test structures for directly measuring a stability of a plurality of static random access memory (SRAM) cells includes multiple levels of transmission gates (TGs), a first chip analog input/output (IO), and a second chip analog IO. A plurality of internal nodes of the plurality of SRAM cells are electrically coupled through the multiple levels of transmission gates (TGs) to one of the first chip analog IO and the second chip analog IO, wherein each of the test structures is operable to address a respective one of the plurality of SRAM cells, and each of the plurality of test structures are operable to measure static noise margin (SNM) of a respective one of the plurality of SRAM cells.

BRIEF DESCRIPTION OF THE DRAWINGS

The accompanying drawings, which are incorporated in, and constitute a part of this specification, illustrate implementations of the present teachings and, together with the description, serve to explain the principles of the disclosure. In the figures.

Figure 1:
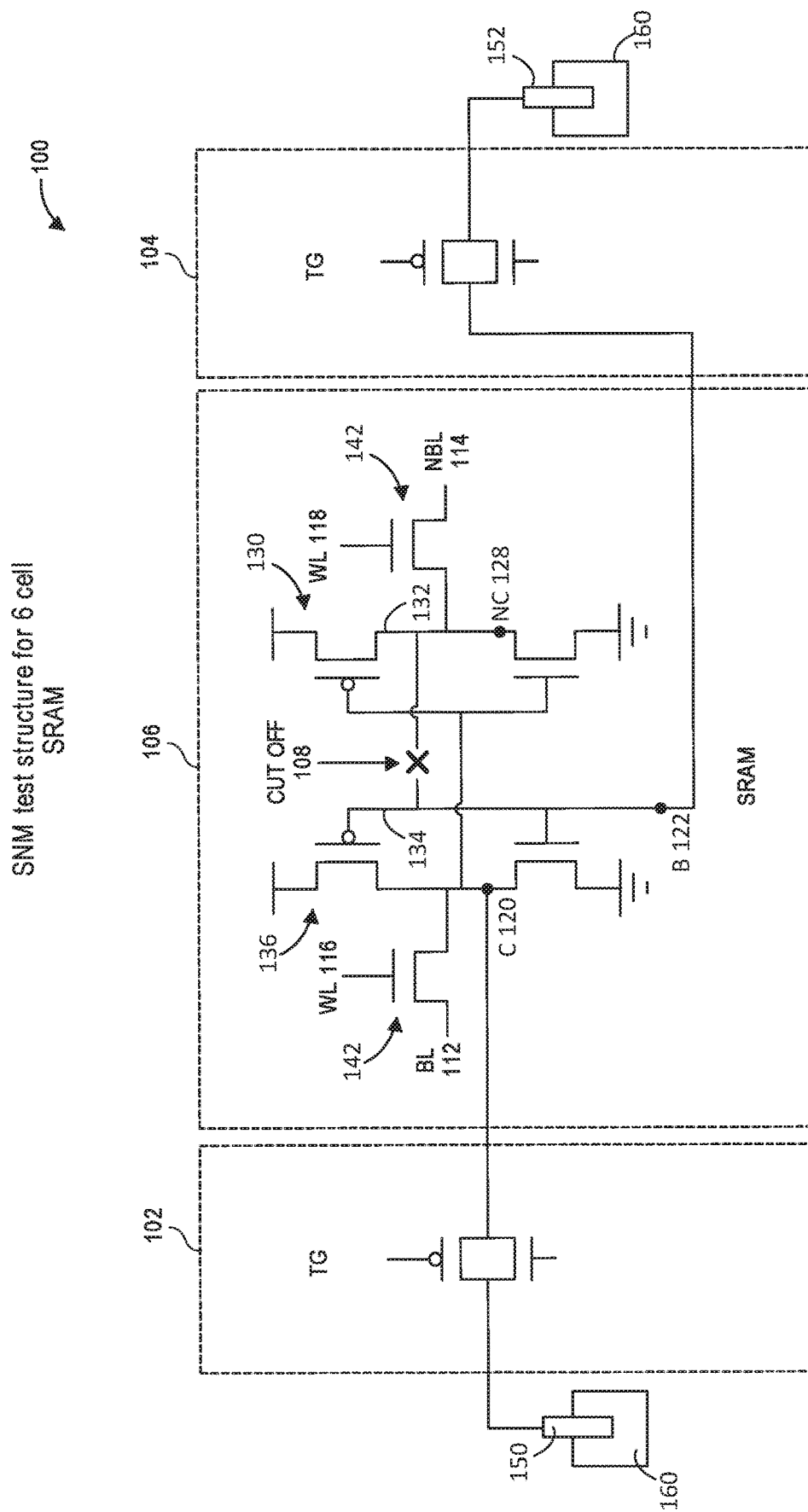
FIG. 1 is a block diagram of a test structure including a transmission gate (TG) for measuring static noise margin (SNM) of a 6-transistor static random access memory (SRAM) cell, according to examples of the present disclosure.

It should be noted that some details of the figures have been simplified and are drawn to facilitate understanding of the present teachings rather than to maintain strict structural accuracy, detail, and scale.

DETAILED DESCRIPTION

Reference will now be made in detail to exemplary implementations of the present teachings, examples of which are illustrated in the accompanying drawings. Wherever convenient, the same reference numbers will be used throughout the drawings to refer to the same or like parts.

As used herein, "Static noise margin (SNM)" of an SRAM cell refers to the maximum value of the static voltage noise that can be tolerated by the SRAM cell without flipping (i.e., changing) the binary state of the SRAM cell or otherwise changing the stored content of the SRAM cell. That is, SNM means the maximum value of the static voltage noise that a SRAM cell can tolerate without changing its binary state. In certain situations, exceeding the SNM may corrupt data stored in the SRAM cell. In many applications such as aircraft avionics, particularly in flight-critical components, data corruption or data loss is not tolerable. The static noise is caused, at least in part, by the offsets and mismatches that come from variations in processing and operation conditions. Further, for purposes of the present disclosure and unless otherwise specified, the term "electrically coupled" (e.g., a first point or structure "electrically coupled" to a second point or structure) indicates that the first point or structure is electrically influenced by the second point or structure. The electrical coupling can be a direct electrical connection, or an indirect electrical connection with one or more points or structures being electrically positioned between the first and second points or structures. Further, the term "cut off" refers to an electrical open formed or positioned at a location between two points or structures within a circuit where, during normal operation of the circuit during an intended use of the circuit, the two points are normally electrically shorted together.

In various implementations, test structures are provided to measure the stability of a static memory cell or a plurality of SRAM cells in an Integrated Circuit (IC) fabricated using a complementary metal-oxide-semiconductor (CMOS) manufacturing process wherein, during the manufacturing process, the feedback between internal storage nodes is broken and the internal storage nodes of the memory cells are connected to external pins.

In some such implementations, connection to external pins is made through a transmission gate (TG). According to some such implementations, the TG uses the same transistors as used in SRAM cells.

According to certain such implementations, a test structure includes an array of cells with addressing to measure SRAM in a plurality of SRAM cells.

In various implementations, methods measure the stability of a plurality of SRAM cells within an IC that has been fabricated using a CMOS process. The measurement can include the use of a test structure, where feedback between internal storage nodes is disconnected (i.e., broken), and the internal storage nodes are connected to external pins.

In some such implementations, the method includes measuring a transfer curve from one side and assuming the other side of the transfer curve (i.e., the unmeasured side) is symmetric.

According to some such implementations, the method includes measuring respective transfer curves for a plurality of SRAM cells and statistically extracting or extrapolating the other side of the transfer curve based on the distribution of the measured transfer curves.

In accordance with some such implementations, the method includes using one column (a first column) to measure a first side (e.g., a left side) of an SRAM cell including, for example, inverter 136 in FIG. 1, and another column (a second column) to measure a second side (e.g., a right side) of the SRAM cell including, for example, inverter 130 in FIG. 1.

SRAM stability is a factor on the ability to read, hold, and write to the cell, for instance, the more stable a SRAM cell is to read or hold, the more difficult it is to write to the cell, and vice versa. SNM measurements provide an insight to most issues and problems that may arise during the operation of the SRAM within extreme environments, such as, for example, in space and other high radiation environments, in low temperature applications, and in high reliability applications. In these extreme environments, the SNM of an SRAM cell must be particularly low to reduce or avoid data loss.

SNM simulation is used during SRAM cell design when silicon measurement for SNM is not often feasible or readily available. Limited by the access to silicon fabrication resources and project schedules, SRAM designers typically rely on transistor models provided by a semiconductor foundry, and only perform simulations to determine SNM. Although this can be sufficient in many cases, accuracy can depend on how carefully the semiconductor foundry models the SRAM cell. Because SRAM cells are required components in many technologies and applications, foundries typically provide various SRAM cells to satisfy design requirements, such as, for example, high-speed or high-density SRAM requirements. With the advancement of SRAM cell fabrication technology, designers typically use the SRAM cells provided by the foundry, and SNM characterization of the new device design is typically completed using device simulations rather than actual device testing, with varying degrees of success.

When SRAM cells are required to operate in special conditions that are not covered by foundry models, such as in space or other high radiation environments or within cryogenic conditions, it is necessary to measure SNM on manufactured devices rather than through device simulations. Measurement of SNM has traditionally been done in three ways. The first approach includes the use of probe points to electrically access and measure SRAM cell internal nodes. The second approach includes the fabrication of an isolated individual SRAM cell, where the internal nodes are electrically connected to conductive bumps to provide electrical access and allow measurement. However, a drawback to both of these traditional approaches is that they require a large amount of test time on costly qualification or testing equipment and, as such, only a small number of SRAM cells can be measured and/or characterized. The third traditional approach is to measure SNM indirectly. This approach is sufficient for measuring write SNM, where the write SNM is measured by a rising bit line (i.e., bit line "BL" or negative bit line "NBL") from ground or lowering power from normal operation voltage until the SRAM cell flips, while the word line is held at the power supply. The difference in voltage between electrical ground and the bit line is the write ability margin (WAM). Alternatively, the bit lines (BL and NBL) are set at the power supply and at ground while the word line (WL) can be ramped up until the SRAM cell flips, in which case the difference in voltage between the power supply and the WL is the write ability margin. The write ability margin obtained in these two indirect measurement approaches provides an indirect indication of the write SNM. However, it is not easy or always feasible to measure read and hold SNM using indirect measurement approaches.

Implementations of the present teachings allow various technical advantages over prior SNM measurements. For example, the improved, direct SNM measurement test structures and techniques described below with reference to FIGS. 1-13 measure the SNM of an SRAM cell directly and address the above-noted issues of conventional approaches. The following paragraphs describe example test structures and techniques for measuring SNM using transmission gates (TGs) in order to provide flexible and direct access to SRAM internal nodes. The example test structures can measure SNM of large number of SRAM bits in a short time. For example, referring to FIG. 2, the test structure 200 allows serial (sequential) testing of each SRAM cell 206, 206', 206" within a single column 1-4. In addition, setup of the example test structures is relatively uncomplicated. In some examples, the test structures may be implemented with a commercial 14 nanometer (nm) technology. Further, the test structures may be implemented without measurement cells that are required by some conventional SNM measurement devices, thereby avoiding the need for the formation and/or use of measurement cells in an implementation of the present teachings.

To facilitate an understanding of the various implementations, the general architecture of an exemplary SRAM SNM test structure will be described. The specific architecture of various alternate implementations of direct test structures for measuring SNM for various types of SRAM memory cells will then be described.

FIG. 1 is a block diagram including measurement circuitry of a test structure 100, the test structure 100 and measurement circuitry including a transmission gate (TG) 102 (i.e., a first TG 102) and a TG 104 (i.e., a second TG 104) for measuring SNM of a 6-transistor SRAM cell 106, according to examples of the present disclosure. As depicted in FIG. 1 and described below, the 6-transistor SRAM cell 106 and measurement circuitry can include a cut off 108, bit lines (BL 112 and NBL 114), a word line (depicted as WL 116 and WL 118, where WL 116 and WL 118 are electrically coupled together), and internal nodes (C 120; B 122; and NC 128).

The test structure 100 provides controllability and observability to the internal nodes C 120, B 122, and NC 128 of the SRAM cell 106 for measuring SNM of the SRAM cell 106. In various implementations, the design of the test structure 100 can begin with, for example, a foundry-provided 14 nm high-density SRAM cell. Other types of SRAM cells and density are also contemplated. That is, in the example shown in FIG. 1, the SRAM cell 106 may be a 14 nm high-density SRAM cell. With continued reference to FIG. 1, the test structure 100 includes TG 102 and TG 104, where TG 102 is connected to internal node C 120 and TG 104 is connected to internal node B 122. In the example test structure 100, the transistors of TG 102 and TG 104 may be the same transistor types as the in the SRAM cell 106 which, at least in part, enables the layout to pass stringent design rules checks (DRC). To reduce or prevent disturbance from the right side inverter 130 during testing, electrical connection from the output 132 of the right side inverter 130 to the input 134 of the left side inverter 136 is removed, depicted in FIG. 1 as cut off 108. As shown in FIG. 1, the SRAM cell 106 includes bit lines BL 112 and NBL 114 that are connected to external write or read circuits, and a word line (WL 116 and WL 118, electrically coupled together and referred to herein collectively as the "word line") can be ramped up until the SRAM cell 106 flips. Electrical access to the SRAM cell 106 is enabled, at least in part, by the word line (WL 116 and WL 118 in FIG. 1), which controls a first access transistor 140 and a second access transistor 142 which, in turn, control connection of the SRAM cell 106 to the bit lines BL 112 and NBL 114. In some implementations, the bit lines BL 112 and NBL 114 may be used to transfer data for both read and write operations.

In order to work within limited available space, in the example test structure 100, only node B 122 and node C 120 are connected to the outside of the SRAM cell 106. As shown in FIG. 1, node NC 128 is not directly electrically connected to the outside of the SRAM cell 106. That is, node NC 128 is not externally connected or directly accessible. Because the SRAM cell 106 is generally symmetrical, the left and right side transistors should have the same electrical and operating characteristics, apart from process variation. This assumption can be verified with one column of SRAM cells to measure the left side of cells, and another column to measure the right side of cells. Using the test structure 100, voltage transfer characteristics (VTCB) from the left side transistors of the SRAM cell 106 are sufficient to calculate SNM. Therefore, node NC 128 does not need to be controlled and measured to permit calculation of the SNM of the SRAM cell 106 depicted in FIG. 1, where "NC" thereby indicates that the node is not connected directly to the outside of the cell.

FIG. 1 further depicts a first external pin 150 and a second external pin 152. In FIG. 1, the internal node C 120 is electrically coupled through TG 102 to the first external pin 150. Further, the internal node B 122 is electrically coupled through TG 104 to the second external pin 152. The external pins 150, 152 thus allow electrical access to each of the internal nodes C 120, B 122. The external pins 150, 152 of the test structure 100 can be electrically coupled to a test fixture 160 (e.g., semiconductor test equipment) that is configured to apply suitable test voltages and current to the SRAM cell 106. It will be appreciated that, while not individually depicted for simplicity, internal node NC 128 is similarly connected to a third external pin and to the test fixture 160. Each of the internal nodes of the implementations as discussed below may be similarly electrically coupled to external pins to allow an interface with a test fixture 160, but are not individually depicted for simplicity.

Figure 2:
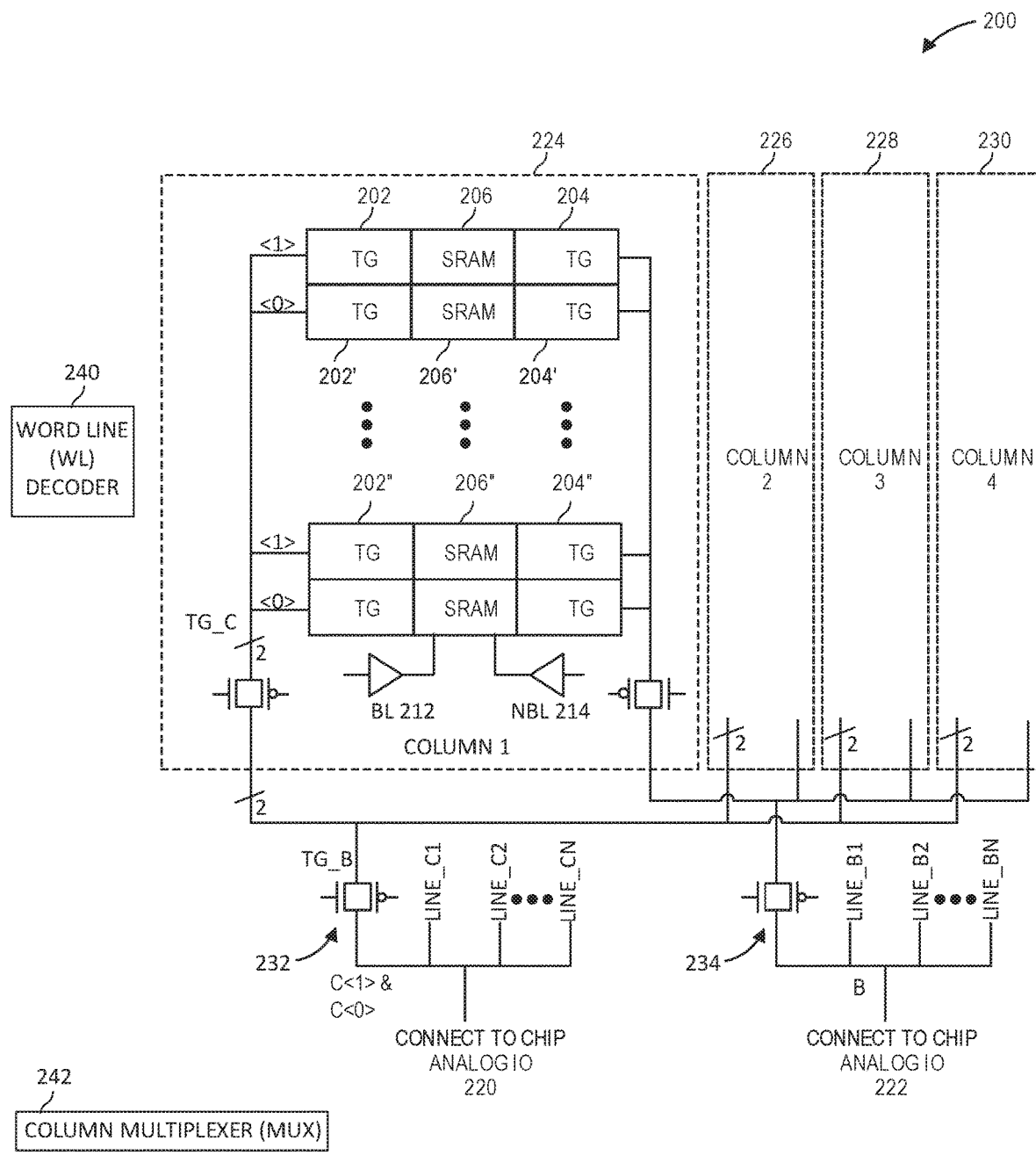
FIG. 2 is a block diagram of a test structure for measuring SNM of an array of SRAM cells, according to examples of the present disclosure.

FIG. 2 is a block diagram of a test structure 200 for measuring SNM of an array of SRAM cells, according to examples of the present disclosure. The test structure 200 is able to test large number of SRAM cells in an SRAM array in a short amount of time with relatively uncomplicated setup.

As shown in FIG. 2, the internal nodes from each bit are connected together through multiple levels of transmission gates (TGs), including TG, TG_C, and TG_B, to chip input/output (IO) (e.g., depicted in FIG. 2 as chip analog IO 220 and chip analog IO 222) for testing. For instance, TGs 202, 202', 202", etc., can be connected to chip analog IO 220 and TGs 204, 204', 204", etc., can be connected to chip analog IO 222. It will be appreciated by one of ordinary skill in the art that the structures depicted within Column 1 are similarly reproduced in Columns 2-4, but have not been individually depicted for simplicity. Furthermore, it will be appreciated that while FIG. 2 depicts at least four rows of SRAM cells (206, 206', 206", plus one unnumbered) within Column 1, and ellipses indicating additional rows, an actual device may have any number of rows of SRAMs. Access to the internal nodes of a SRAM cell are allowed by enabling the transmission gates of a specific row and column. In the example implementation of the test structure 200 shown in FIG. 2, each row includes many SRAMs cells and TGs adjacent to each SRAM cell (see, e.g., SRAM cells 206, 206', 206" and their respective, adjacent TGs 202, 202', 202", 204, 204', 204"). Similarly, each column in the test structure 200 can include connections to chip analog IO 220 and 222 (see, e.g., columns 224, 226, 228 and 230 and their respective connections to chip analog IO 220 and chip analog IO 222 in FIG. 2). In the test structure 200, access to SRAM cells 206, 206', 206" can be switched quickly and easily through row decoding circuitry of the test structure 200. For example, in the test structure 200, the bit lines BL 212 and the NBL 214, are driven by control logic independently, so as to allow various setups for read, hold and write SNM measurement for SRAM cells 206, 206', 206" in column 224. The internal nodes of each SRAM cell can be individually accessed to perform the SNM measurement. The internal nodes of each SRAM cell in each of Columns 2-4, which are not individually depicted for simplicity, are similarly addressed and accessed.

The voltage drop along the path from chip analog input/output (IO) to internal nodes of an SRAM cell is a significant factor resulting in SNM measurement error. For example, with reference to FIG. 2, the voltage drop occurs along a path from chip analog IO 220 to internal nodes of SRAM cells 206, 206' and 206". While the internal nodes accessed by the features of FIG. 2 have not been depicted for simplicity, analogous internal nodes 120, 122, and 128 are depicted and described with reference to FIG. 1. With continued reference to FIG. 2, the following components can contribute to the voltage drop along the path from chip analog IO 220 to chip analog IO 222: 1) Voltage across the drain and source of transmission gates (e.g., across the drain and source of each of TGs 202, 202', 202", 204, 204', 204" of FIG. 2); 2) Current-Resistance (IR) drop resulting from metal resistance along the path; and 3) voltage drop in chip analog IO 220 or chip analog IO 222.

In the example test structure 200 as depicted in FIG. 2, each transistor in the transmission gate laterally adjacent to each of the SRAM cells has the same size as those in each of the SRAM cells. For instance, with reference to column 224 of FIG. 2, the TGs 202, 202', 202", 204, 204', and 204" adjacent to the SRAM cells 206, 206', and 206" have a fixed size, where the size of each TG is the same as the size of the SRAM cell 206, 206', and 206" with which it is paired. Further, FIG. 2 depicts a first transmission gate 232 and a second transmission gate 234 that enable selection (addressing or accessing) of the internal nodes of each SRAM cell in one of Columns 1-4 (i.e., 224-230). These transmission gates can be designed with a size that is sufficient that the voltage drop from the drain to the source is small enough that measurement accuracy is not adversely impacted (e.g., not excessively impacted), since they are handing both active current from the selected (active) SRAM cell and leakage current from other unselected (inactive) SRAM cells. In the example implementation in a 14 nm technology, the voltage across all levels of transmission gates can be limited, for example, to less than 1% of power supply voltage (e.g., 8 mV as the $V_{DD}$=0.8V or less).

In some implementations, an unacceptably large voltage drop can be reduced, for example, by decreasing the electrical resistance and/or current along the electrical input and output paths to and from each internal node of each SRAM cell in the SRAM array. Increasing a cross section of wire interconnects, for example, by increasing the width and/or the thickness of the wire interconnect, will decrease electrical resistance and current. Further, reducing the length of the wire interconnects, for example, by forming the electrical path using plural, shorter wire interconnects in multiple layers of metal and redundant conductive vias. Since the active current of selected SRAM cells is required for a SNM measurement, it will be appreciated that only the leakage current from unselected SRAM cells can be reduced by using a smaller number of rows of SRAM cells in each column. That is, reducing the number of SRAM cells 206, 206', 206" in each of Columns 1-4 (224-230) in the test structure 200 of FIG. 2 will reduce the leakage current from unselected SRAM cells, there being fewer cells to contribute leakage current. In certain implementations, the IO structures, chip analog IO 220 and chip analog IO 222, are selected and configured to ensure an acceptable voltage drop while also providing a sufficient protection from electrostatic discharge (ESD) for the test structure 200.

The test structure 200 of FIG. 2 can include calibration of a voltage drop in the measurement circuitry as depicted using the same word line (WL) decoder 240 and column multiplexer (mux) 242 peripheral circuitry used by the one or more the SRAM cells (e.g., 206, 206', 206"). It will be appreciated by one of ordinary skill in the art that the structures depicted within the four dashed rectangles are reproduced across any number of structural iterations of analogous or corresponding structures, where each structural iteration (not individually depicted for simplicity) is coupled to one of the interconnects labeled "LINE_C1" to "LINE_CN" and to one of the interconnects labeled "LINE_B1" to "LINE_BN".

Figure 3:
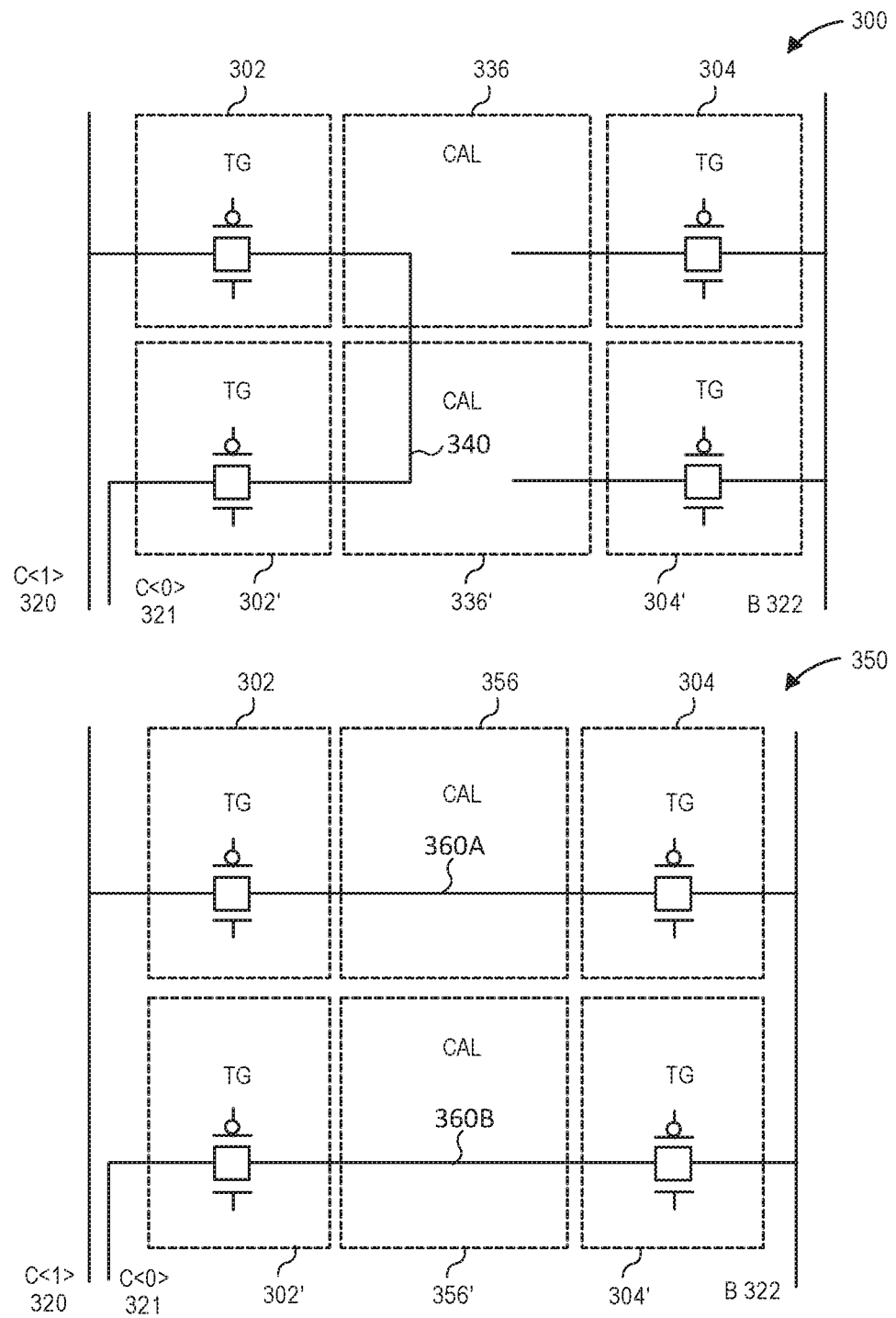
FIG. 3 depicts input and output paths of two kinds of SRAM cells that can be provided within the SRAM cell array of FIG. 2 to measure voltage drop, according to examples of the present disclosure.

FIG. 3 depicts input and output paths of two implementations of SRAM cells 300, 350 that can be formed within the array of SRAM cells of FIG. 2 to measure voltage drop, according to examples of the present disclosure.

As shown in FIG. 3, the example SRAM cell 300 includes cells for output path to C<1> 320 and output path to C<0> 321. In particular, in the SRAM cell 300, a calibration (CAL) cell 336 and a CAL cell 336' are connected to each other, to the output path to C<1> 320, and to the output path to C<0> 321. The SRAM cell 300 further includes TG 302, CAL cell 336, CAL cell 336', and TG 302'. FIG. 3 also shows that in the SRAM cell 350, TG 302 and TG 304 are connected to each other via CAL cell 356 and the output path to C<1> 320 includes TG 302, CAL cell 356 and TG 304. As further depicted in FIG. 3, in the SRAM cell 350, input path B 322 includes TG 304 and TG 304', where TG 304 can be connected to CAL cell 356, which in turn is connected to TG 302. In some implementations, SNM measurements are based on readings that compensate for voltage drop along paths (e.g., output paths to C<1> 320 and C<0> 321, and input path B 322) to the internal nodes of SRAM cells 300 and 350 (e.g., CAL cell 336, 336', 356 and 356').

In the scheme described above with reference to FIG. 2, voltage drop along the electrically conductive paths to the SRAM nodes are the major reason for measurement errors. Although the voltage drop can be minimized by using large size transmission gate (TG), careful consideration in layout, and selecting an optimal IO structure, the voltage drop can still be sufficiently large to cause SNM measurement errors. For example, in reliability tests, cryogenic conditions, and radiation tests, the voltage drop through a TG and metal electrical resistance in layout may increase dramatically. In this example, it may be necessary to monitor the voltage change and compensate for the voltage change in the SNM measurement.

FIG. 3 shows two different implementations of example SRAM cells 300, 350 that can be formed within the SRAM array of FIG. 2 to measure voltage drop. The SRAM cells 300, 350 are similar to the SRAM cell 106 shown in FIG. 1, with the SRAM cell 106 being replaced with a CAL cell (e.g., CAL cells 336, 336', 356, 356' in the example of FIG. 3). As shown in the example of FIG. 3, the CAL cells 336, 336', 356, 356' can have short or open connections. According to some implementations, the CAL cells 336, 336', 356, 356' may be implemented starting with a SRAM cell (e.g., SRAM cell 300 or 350) and changing metal connections. The SRAM cell 300 shown in FIG. 3 can be used to measure the output paths to C<1> 320 and C<0> 321 from the SRAM internal node. By configuring the selection of transmission, the output path to C<0> 321 can be connected a voltage source while voltage for output path to C<1> 320 is measured. The voltage difference from the voltage source and measured voltage is the voltage drop along the output paths to C<1> 320 and C<0> 321. In the example implementation of FIG. 3, half of the value is the voltage drop along one output path (e.g., one of output paths to C<1> 320 and to C<0> 321). According to some implementations, such an output path may be the same path as that from SRAM internal nodes, except that the SRAM cell (e.g., SRAM cell 106 of FIG. 1) is replaced with a CAL cell (e.g., CAL 336 or 336' of FIG. 3). In certain implementations, the voltage drop along output path to C<1> 320 can be measured using the SRAM cell 300 shown in FIG. 3. In additional or alternative implementations, the SRAM cell 350 shown in FIG. 3 can be used to measure the voltage drop along input path B 322 and output path C<0> 321. The voltage drop along input path B 322 can be calculated. That is, the two SRAM cells 300, 350 of FIG. 3 can be used to measure the voltage drop. In an implementation of the present teachings, a measurement circuit of the SRAM cells 300, 350 can include one or more connecting wires 340, 360A, 360B, where each connecting wire 340, 360A, 360B electrically couples a first TG and a second TG, and extends from the first TG to the second TG, such as depicted in FIG. 3.

In accordance with certain implementations, a complete design structure (e.g., a direct measurement test structure) may be implemented with a commercial 14 nm technology. Such a test structure may be used to simulate the read, write and hold SNM of foundry-provided SRAM cells. A description of connectivity of the SRAM circuit design (i.e., a netlist) with parasitic extracted for such a test structure and IO structure may be used in the simulation. Example simulation results provided in Table 1 below show that VTC curves simulated from a direct measurement test structure are very close to those simulated from an SRAM cell directly. The differences are too small to be shown in a plot. That is, differences between the VTC curves simulated from the direct measurement test structure and the VTC curves simulated directly from an SRAM cell are statistically insignificant. Therefore, only calculated SNM values are listed in Table 1 below. The simulation in this example covers typical (TT), slow (SS) and fast (FF) process corners. The voltage range is from 0.7V to 0.9V, with a typical operation voltage of 0.8V. In the example results shown in Table 1, the operation temperature ranges from −55° C. to 125° C., with an intermediate simulation at a temperature of 27° C. The largest, or worst, error or difference between the SNM from the direct measurement test structure and the SRAM cell is 4.0%.

TABLE 1

Comparison of simulated SNM measurements from an SRAM test structure and an SRAM cell

| | SNM test structure | SRAM cell | Error |
|---|---|---|---|
| | −55° C. 0.9 V FF | | |
| Write SNM (V) | 0.29 | 0.29 | 1.4% |
| Read SNM (V) | 0.13 | 0.14 | −3.9% |
| Hold SNM (V) | 0.36 | 0.36 | −0.5% |
| | 27° C. 0.8 V TT | | |
| Write SNM (V) | 0.27 | 0.27 | 0.9% |
| Read SNM (V) | 0.15 | 0.15 | −1.5% |
| Hold SNM (V) | 0.34 | 0.34 | −0.1% |
| | 125° C. 0.7 V SS | | |
| Write SNM (V) | 0.24 | 0.23 | 4.0% |
| Read SNM (V) | 0.14 | 0.14 | −0.8% |
| Hold SNM (V) | 0.30 | 0.30 | −0.3% |

As shown in the example results of Table 1, the direct measurement test structures described herein provide an approach to measure read, write, and hold SNM of SRAM cells by directly controlling and observing SRAM internal nodes. This approach can measure SNM quickly with a relatively uncomplicated setup. The direct measurement test structures described herein can advantageously be used to characterize SNM for large numbers of SRAM bits in a relatively short time. This approach is suitable, for example, for characterizing SRAM SNM in reliability tests to understand SRAM SNM over SRAM lifetime, in cryogenic conditions, and in radiation testing to understand SRAM SNM degradation in radiation environments. As noted above with reference to the results shown in Table 1, a simulation with an example direct measurement test structure shows that this approach has a maximum error of 4.0% compared to results from a simulated SRAM cell.

Additional direct measurement test structures for measuring SNM of different types of SRAM cells are described in the following paragraphs with reference to the example implementations depicted in FIGS. 4-9. The test structures 400, 500, 600, 700, 800, and 900 of FIGS. 4-9 are described with reference to external TGs that are connected to internal nodes of various types of SRAM cells. The test structures 400-900 are configured to directly measure SNM for additional types of SRAM cells beyond the example 6-transistor SRAM cell 106 described above with reference to FIG. 1. For brevity, generally, only the differences occurring within FIGS. 4-9, as compared to previous or subsequent ones of the figures, are described below.

Figure 4:
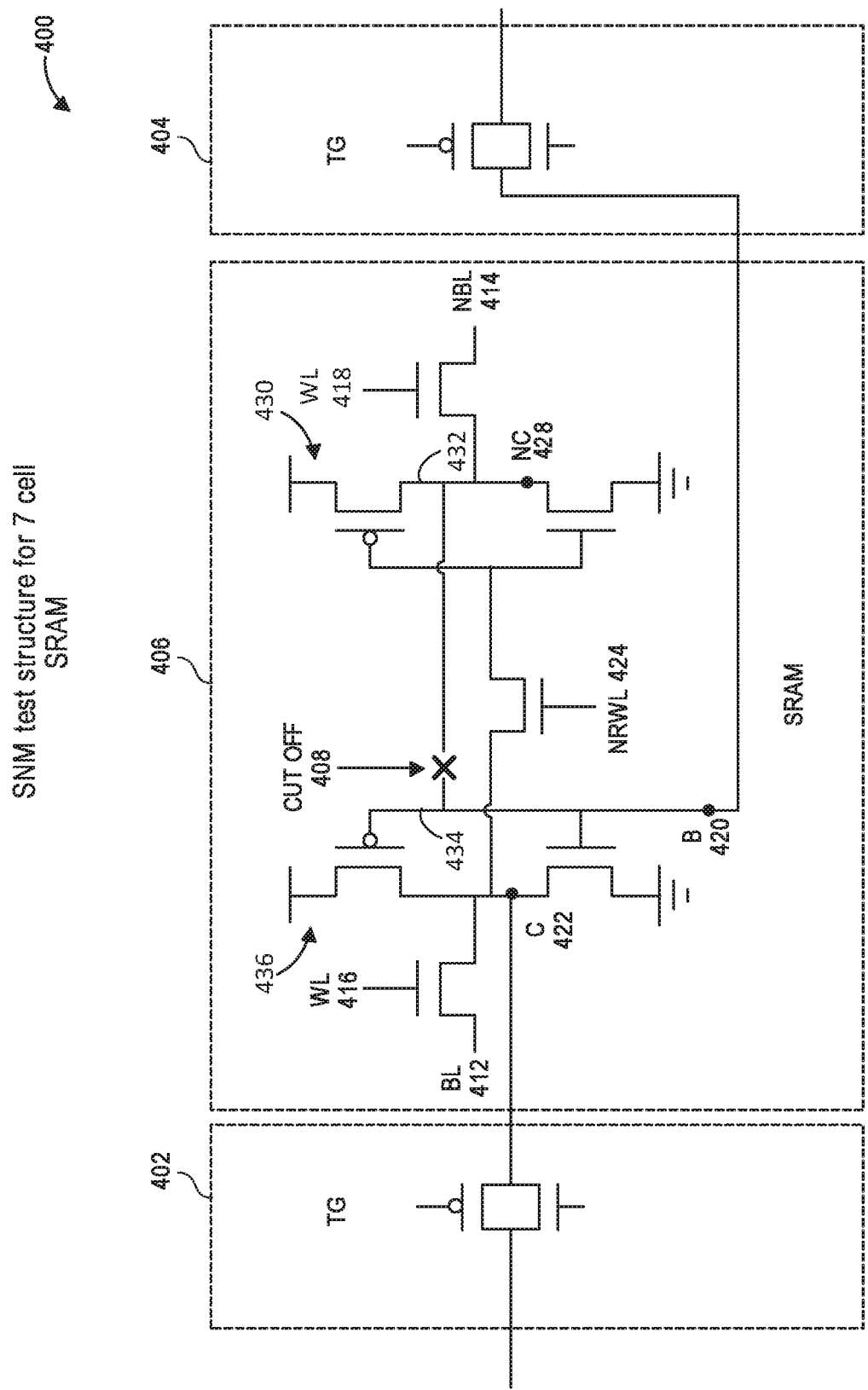
FIG. 4 is a block diagram of a test structure for measuring SNM of a 7-transistor SRAM cell, according to examples of the present disclosure.

FIG. 4 is a block diagram of a test structure 400 including a TG 402 and a TG 404 for measuring SNM of a 7-transistor SRAM cell 406, according to examples of the present disclosure. As shown in FIG. 4 and described below, the 7-transistor SRAM cell 406 can include a cut off 408, a word line (depicted as word line WL 416 and WL 418, where WL 416 and WL 418 are electrically coupled together and are referred to collectively herein as "word line"), a negative read word line (NRWL) 424, bit lines BL 412 and NBL 414, and internal nodes B 420, C 422, and NC 428.

The test structure 400 provides controllability and observability to internal nodes of the 7-transistor SRAM cell 406 that are critical to measuring SNM of the SRAM cell 406. In the example implementation shown in FIG. 4, TG 402 is connected to internal node C 422 and TG 404 is connected to internal node B 420. In the example test structure 400, the transistors of TG 402 and TG 404 may be the same transistor types as the SRAM cell 406 which, at least in part, enables the layout to pass stringent DRC. To reduce or prevent disturbance from the right side inverter 430 during testing, electrical connection from the output 432 of the right side inverter 430 to the input 434 of the left side inverter 436 is removed, depicted in FIG. 4 as cut off 408. As shown in FIG. 4, the SRAM cell 406 includes bit lines BL 412 and NBL 414 that are electrically coupled to external write or read circuits, and a word line (WL 416 and WL 418, electrically coupled together and referred to herein collectively as the "word line"), can be ramped up until the SRAM cell 406 flips. The voltage difference between the power supply and the word line is the write ability margin. Electrical access to the SRAM cell 406 is enabled, at least in part, by the word line (WL 416 and WL 418 in FIG. 4), which controls a first access transistor BL 412 and a second access transistor NBL 414 which, in turn, control connection of the cell 406 to the bit lines BL 412 and NBL 414. In some implementations, the bit lines BL 412 and NBL 414 may be used to transfer data for both read and write operations. As further shown in FIG. 4, the SRAM cell 406 also includes internal node NC 428. During a read operation, the NRWL 424 is set to ground to break the feedback, thereby preventing a cell upset during the read operation.

Figure 5:
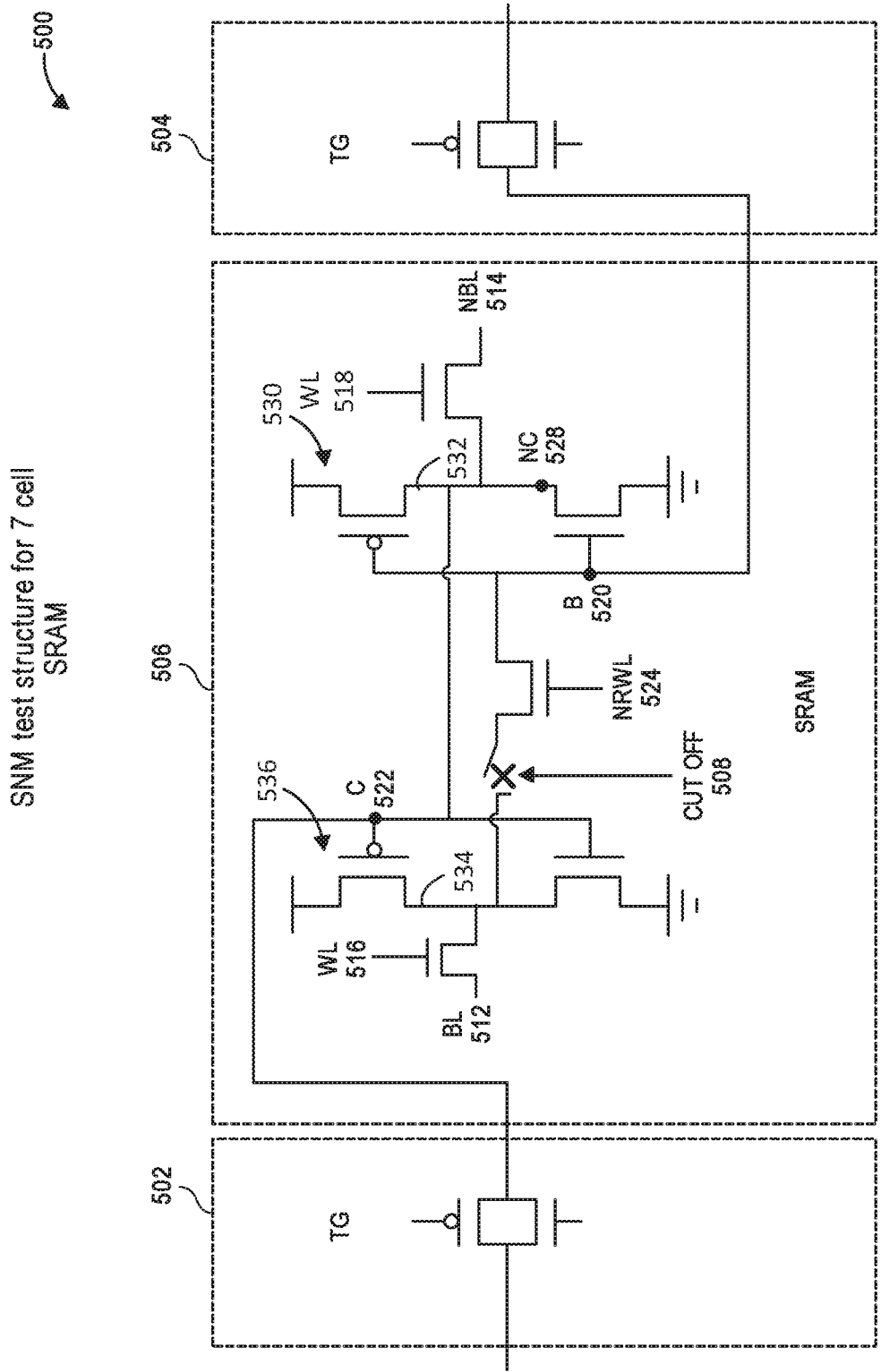
FIG. 5 is a block diagram of another test structure for measuring SNM of a 7-transistor SRAM cell, according to examples of the present disclosure.

FIG. 5 is a block diagram of another test structure 500 for measuring SNM of a 7-transistor SRAM cell 506, according to examples of the present disclosure. As shown in FIG. 5 and described below, the 7-transistor SRAM cell 506 can include a cut off 508, a word line (e.g., WL 516 and WL 518, which are electrically coupled together and referred to herein as the "word line"), a NRWL 524, bit lines BL 512 and NBL 514, and internal nodes B 520, C 522, and NC 528.

In the example implementation shown in FIG. 5, the test structure 500 includes a TG 502 and a TG 504, where TG 502 is connected to internal node C 522 and TG 504 is connected to internal node B 520 of the 7-transistor SRAM cell 506. In the example test structure 500, the transistors of TG 502 and TG 504 may be the same transistor types as the in the SRAM cell 506 to enable the layout to pass stringent DRC. To avoid disturbance from the right side inverter 530, the connection from the output 532 of the right side inverter 530 near internal node B 520 to the input 534 of the left side inverter 536 is removed, as shown in FIG. 5 as cut off 508.

As further shown in FIG. 5, the SRAM cell 506 includes bit lines BL 512 and NBL 514 that are electrically coupled to external write or read circuits, and the word line including WL 516 and WL 518, which may be ramped up until the SRAM cell 506 flips. The voltage difference between the power supply and the word line is the write ability margin. Access to the SRAM cell 506 is enabled by the word line (WL 516 and WL 518), which controls the two access transistors at BL 512 and NBL 514, which, in turn, control connection of the cell 506 to the bit lines BL 512 and NBL 514. According to certain implementations, the bit lines BL 512 and NBL 514 may be used to transfer data for both read and write operations. During a read operation, the NRWL 524 is set to ground to break the feedback, thereby preventing a cell upset during the read operation.

Figure 6:
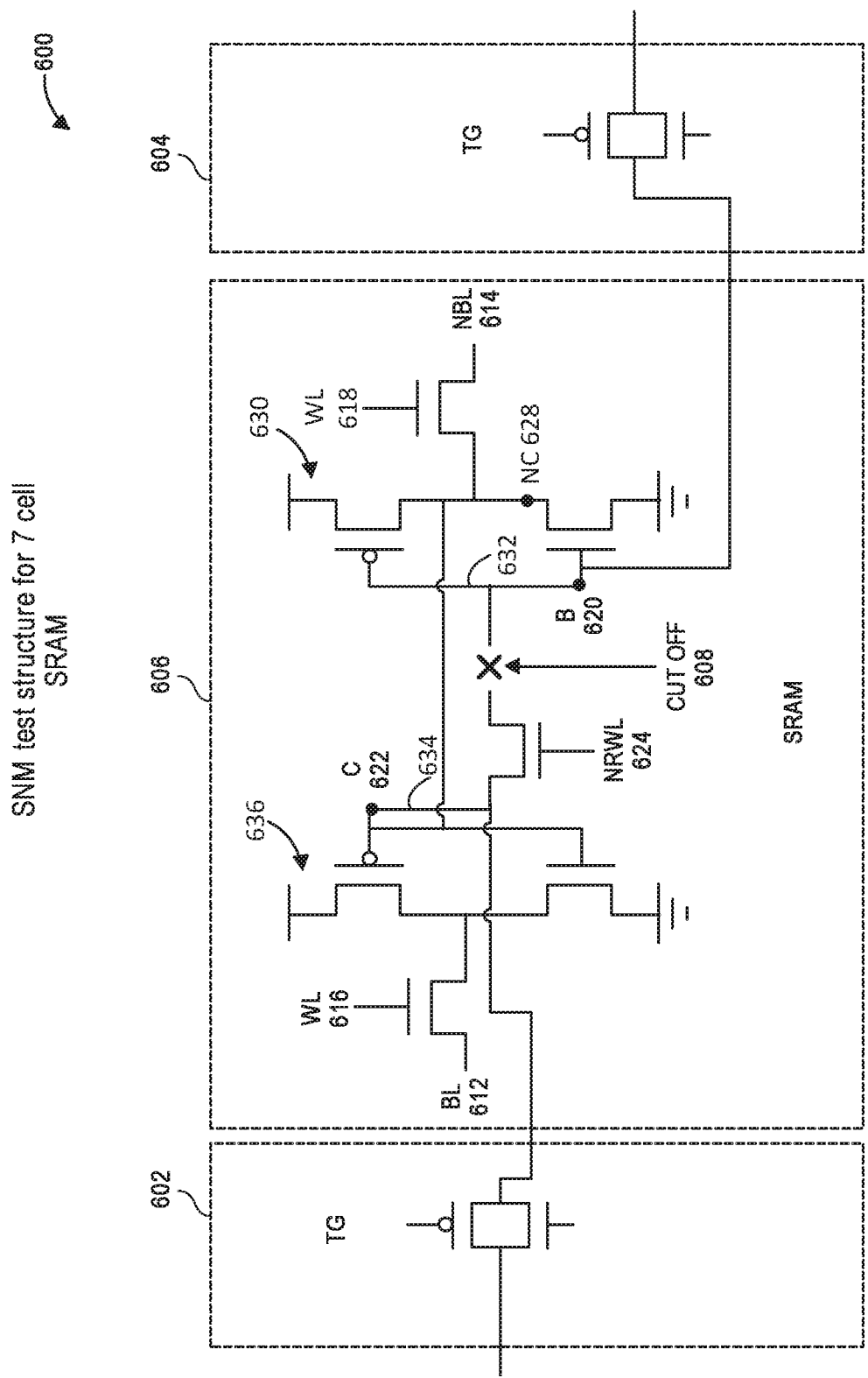
FIG. 6 is a block diagram of yet another test structure for measuring SNM of a 7-transistor SRAM cell, according to examples of the present disclosure.

FIG. 6 is a block diagram of yet another test structure 600 for measuring SNM of a 7-transistor SRAM cell 606, according to examples of the present disclosure. As illustrated in FIG. 6 and detailed below, the 7-transistor SRAM cell 606 can include a cut off 608, a word line (WL 616 and WL 618, which are electrically coupled together and referred to herein as the "word line"), a NRWL 624, bit lines BL 612 and NBL 614, and internal nodes B 620, C 622, and NC 628.

In the example implementation depicted in FIG. 6, the test structure 600 includes a TG 602 and a TG 604, where TG 602 is connected to internal node C 622 and TG 604 is connected to internal node B 620 of the 7-transistor SRAM cell 606. In the example test structure 600, the transistors of TG 602 and TG 604 may be the same transistor types as the in the SRAM cell 606 to enable the layout to pass stringent DRC. As noted above with reference to test structures 400 and 500 shown in FIGS. 4 and 5, to avoid disturbance from the right side inverter 630, in the test structure 600, the connection from the output 632 of the right side inverter 630 to the input 634 of the left side inverter 636 near internal node B 620 is removed, as shown in FIG. 6 as cut off 608.

As further shown in FIG. 6, the SRAM cell 606 includes bit lines BL 612 and NBL 614 electrically coupled to external write or read circuits, and the word line including WL 616 and WL 618, which may be ramped up until the SRAM cell 606 flips. The voltage difference between the power supply and the word line is the write ability margin. Access to the SRAM cell 606 is enabled by the word line WL 616 and WL 618, which controls the two access transistors at BL 612 and NBL 614, which, in turn, control connection of the SRAM cell 606 to the bit lines BL 612 and NBL 614. In certain implementations, the bit lines BL 612 and NBL 614 may be used to transfer data for both read and write operations.

Figure 7:
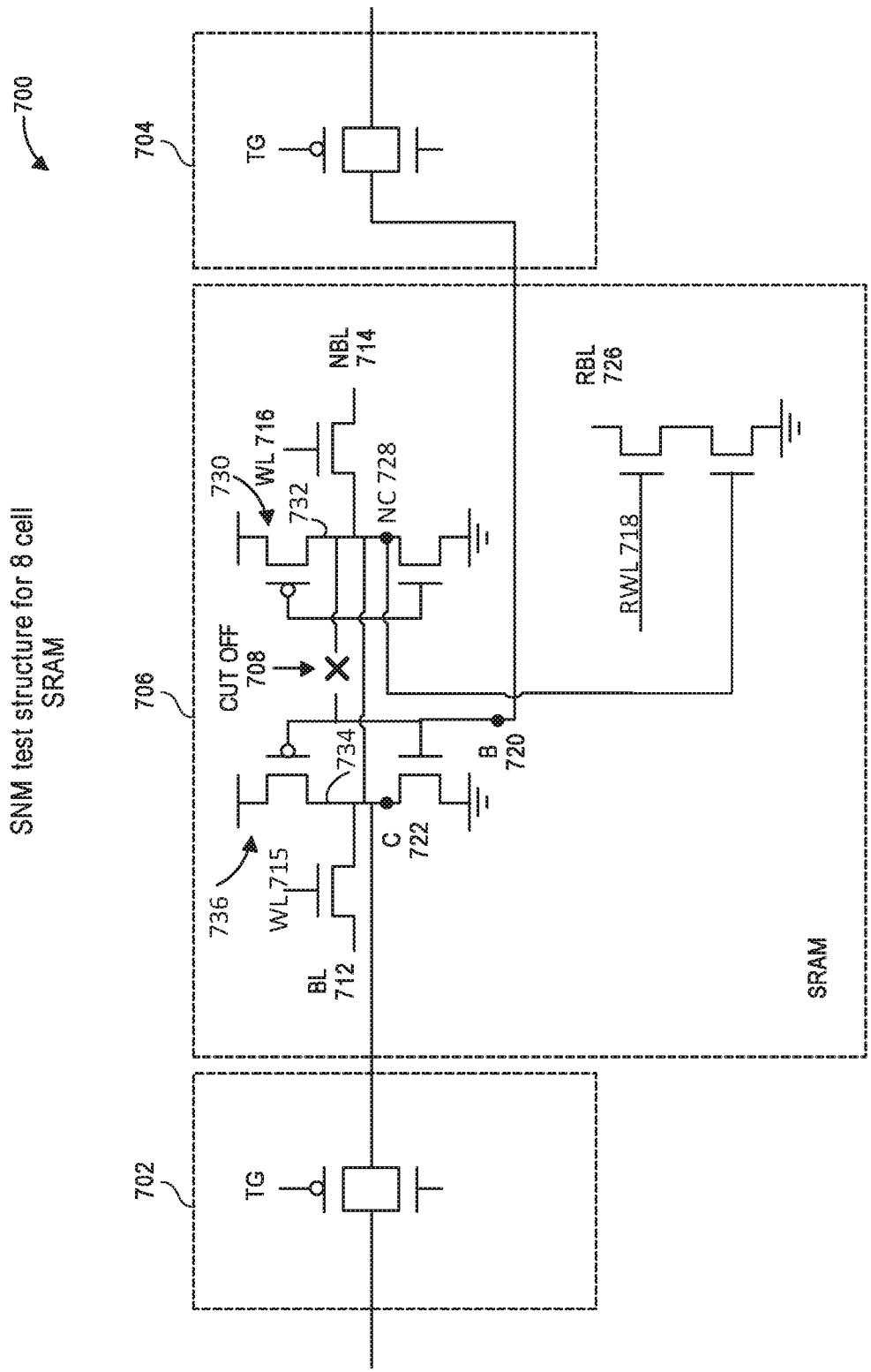
FIG. 7 is a block diagram of a test structure for measuring SNM of an 8-transistor SRAM cell, according to examples of the present disclosure.

FIG. 7 is a block diagram of a test structure 700 for measuring SNM of an 8-transistor SRAM cell 706, according to examples of the present disclosure. As depicted in FIG. 7 and described below, the 8-transistor SRAM cell 706 can include a cut off 708, word line (including WL 715, WL 716, and read word line (RWL) 718, which are electrically coupled together and referred to herein collectively as the "word line"), bit lines including RBL 726, BL 712 and NBL 714, and internal nodes B 720, C 722, and NC 728.

In the example implementation of FIG. 7, the test structure 700 includes a TG 702 and a TG 704, where TG 702 is connected to internal node C 722 and TG 704 is connected to internal node B 720 of the 8-transistor SRAM cell 706. In the example test structure 700, the transistors of TG 702 and TG 704 may be the same transistor types as the in the SRAM cell 706 to enable the layout to pass stringent DRC. To avoid disturbance from the right side inverter 730, the connection from the output 732 of the right side inverter near internal node NC 728 to the input 734 of the left side inverter 736 is removed, as shown in FIG. 7 as cut off 708.

As further illustrated in FIG. 7, the SRAM cell 706 includes bit lines BL 712 and NBL 714 which may be electrically coupled to external write or read circuits, read word line 718 which may be electrically coupled to ground, and word lines WL 715 and WL 716 which may be ramped up until the SRAM cell 706 flips. To set the voltage of RBL 726, the RBL 726 can be pre-charged before the read cycle. During the read, the voltage through RBL 726 can be pulled down or kept high. Writing to the SRAM cell 706 is enabled by the word line WL 715 and WL 716, which control connection to the bit lines BL 712 and NBL 714. During a read operation, RWL 718 is set to high to connect the RBL 726 to the SRAM internal node. Writing to the SRAM cell 706 is enabled using the word line WL 715 and WL 716, which controls connection to the bit lines BL 712 and NBL 714. During the read operation, RWL 718 is set to high to connect the RBL 726 to the SRAM internal node. In some implementations, the bit lines BL 712 and NBL 714 may be used to transfer data for both read and write operations.

Figure 8:
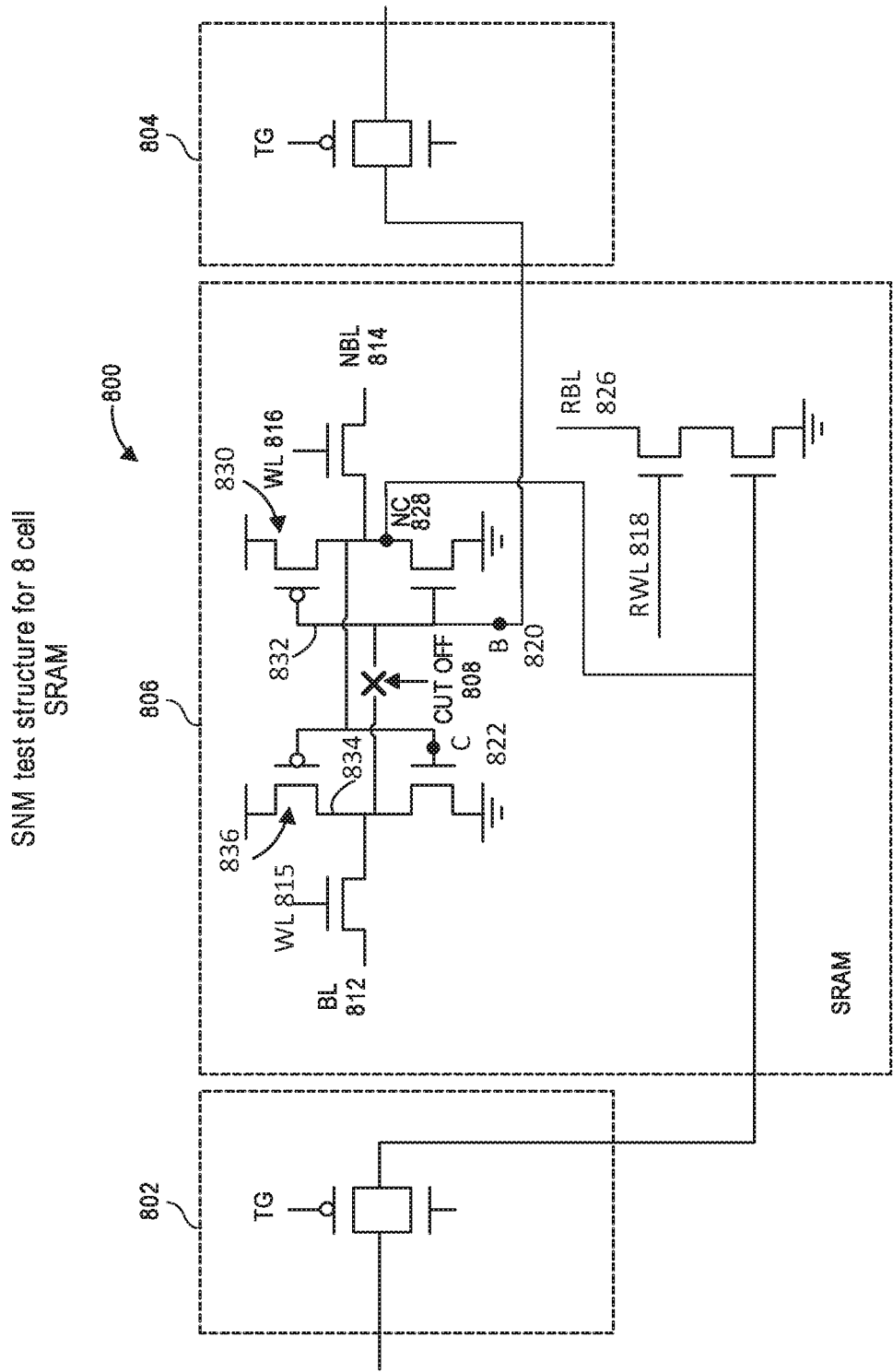
FIG. 8 is a block diagram of another test structure for measuring SNM of an 8-transistor SRAM cell, according to examples of the present disclosure.

FIG. 8 is a block diagram of another test structure 800 for measuring SNM of an 8-transistor SRAM cell 806, according to examples of the present disclosure. As shown in FIG. 8 and discussed below, the 8-transistor SRAM cell 806 can include a cut off 808, a word line (including WL 815, WL 816, and RWL 818, which are electrically coupled together and referred to herein collectively as the "word line"), bit lines RBL 826, BL 812 and NBL 814, and internal nodes B 820, C 822, and NC 828.

In the example implementation of FIG. 8, the test structure 800 includes a TG 802 and a TG 804, where TG 802 is connected to internal node NC 828 and TG 804 is connected to internal node B 822. In the example test structure 800, the transistors of TG 802 and TG 804 may be the same transistor types as the in the SRAM cell 806 to enable the layout to pass stringent DRC. To avoid disturbance from the right side inverter 830, the electrical connection from the input 832 of the right side inverter 830 to the output 834 of the left side inverter 836 is removed, depicted as cut off 808 in FIG. 8 as cut off 808.

As further illustrated in FIG. 8, the SRAM cell 806 includes bit lines BL 812 and NBL 814 which may be electrically coupled to external write or read circuits, and word line WL 815, WL 816 and RWL 818, which may be ramped up until the SRAM cell 806 flips. To set the voltage of RBL 826, the RBL 826 can be pre-charged before the read cycle. During the read, the voltage through RBL 826 can be pulled down or kept high. Writing to the SRAM cell 806 is enabled by the word line WL 815, WL 816, and RWL 818, which control connection to the bit lines BL 812 and NBL 814. During a read operation, RWL 818 is set to high to connect the RBL 826 to the SRAM internal node. Writing to the SRAM cell 806 is enabled using word line WL 815, WL 816, and RWL 818, which controls connection to the bit lines BL 812 and NBL 814. During the read operation, RWL 818 is set to high to connect the RBL 826 to the SRAM internal node. In some implementations, the bit lines BL 812 and NBL 814 may be used to transfer data for both read and write operations.

Figure 9:
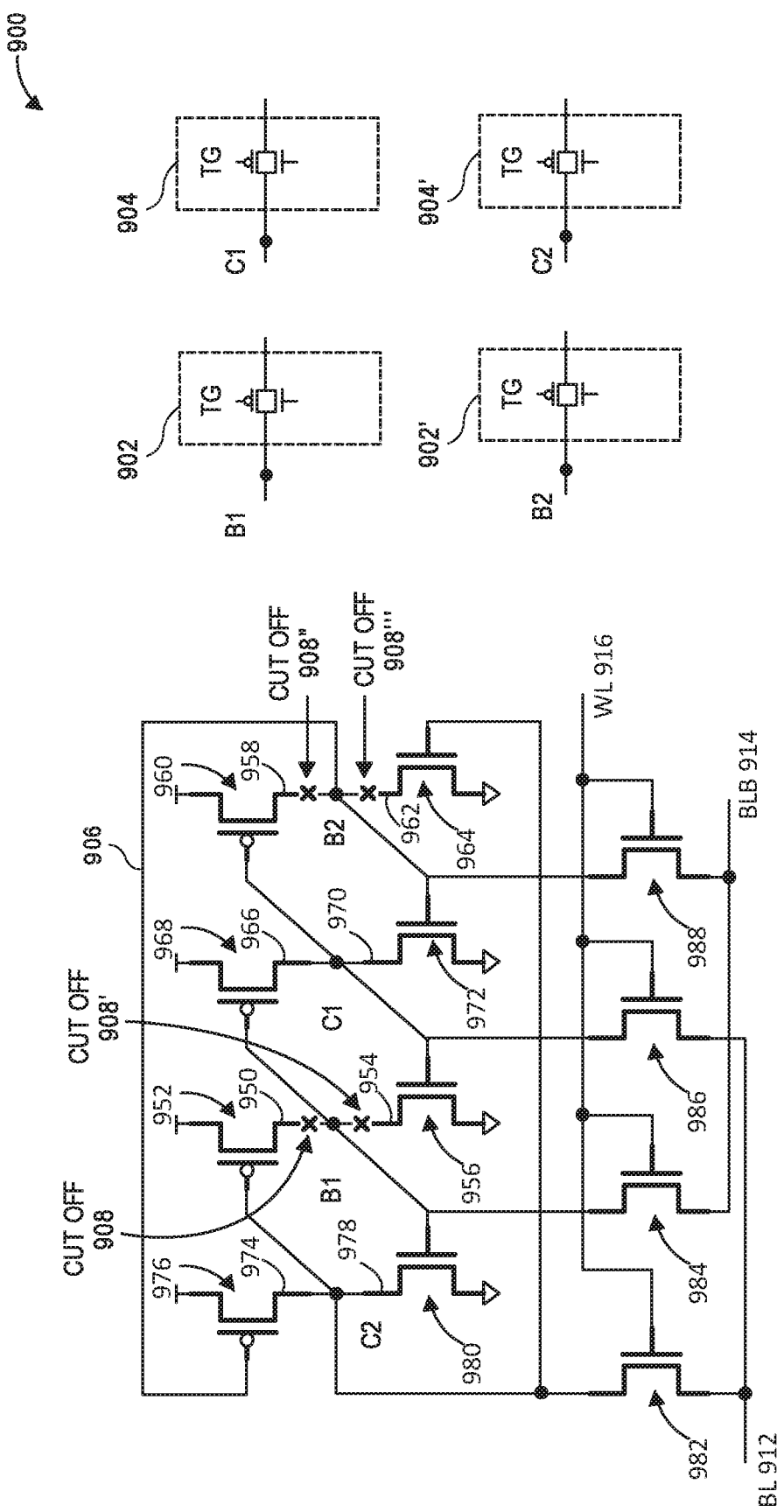
FIG. 9 is a block diagram of a test structure for measuring SNM of a Dual Interlocked Cell (DICE) SRAM cell, according to examples of the present disclosure.

FIG. 9 is a block diagram of a test structure 900 for measuring SNM of a Dual Interlocked Cell (DICE) SRAM cell 906, according to examples of the present disclosure. As shown in FIG. 9, the test structure 900 for the DICE SRAM cell 906 can be implemented to include cut offs 908, 908', 908" and 908''' a word line (e.g., including WL 916), bit lines BL 912 and BLB 914, TGs 902, 902', 904, and 904' and internal nodes B1, C1, B2, and C2.

In the example implementation of FIG. 9, the internal nodes B1, C1, B2, and C2 in the DICE SRAM cell 906 on the left are, electrically, the same point as the internal nodes B1, C1, B2, and C2 on the right side of the figure, and are separately depicted for simplicity. TG 902 is electrically coupled to internal node B1 between cut offs 908 and 908', TG 902' is electrically coupled to internal node B2 between cut offs 908" and 908''', TG 904 is electrically coupled to internal node C1, and TG 904' is electrically coupled to internal node C2. In the example test structure 900, the transistors of TG 902, 902', 904, and 904' may be the same transistor types as the in the SRAM cell 906 to enable the layout to pass stringent DRC.

FIG. 9 depicts that internal node B1 and cut offs 908 and 908' are positioned between the output 950 of inverter 952 and the input 954 of transistor 956. Further, internal node B2 and cut offs 908" and 908''' are positioned between the output 958 of inverter 960 and the input 962 of transistor 964. C1 is positioned between the output 966 of inverter 968 and the input 970 of transistor 972. C2 is positioned between the output 974 of inverter 976 and the input 978 of transistor 980. FIG. 9 further depicts transistors 982, 984, 986, and 988 electrically coupled to WL 916, BL 912, and BLB 914.

As further shown in FIG. 9, the SRAM cell 906 includes the bit line BL 912, its logical compliment, the bitline-bar (BLB) 914, and the word line WL 916. The BL 912 may be electrically coupled to power and its compliment BLB 914 may be electrically coupled to ground, and word line WL 916 may be ramped up until the SRAM cell 906 flips. Access to the SRAM cell 906 is enabled by the word line WL 916. DICE SRAM cells are known in the art, and the formation, implementation, and use of the FIG. 9 device, and like devices, will be appreciated by one of ordinary skill in the art.

Figure 10:
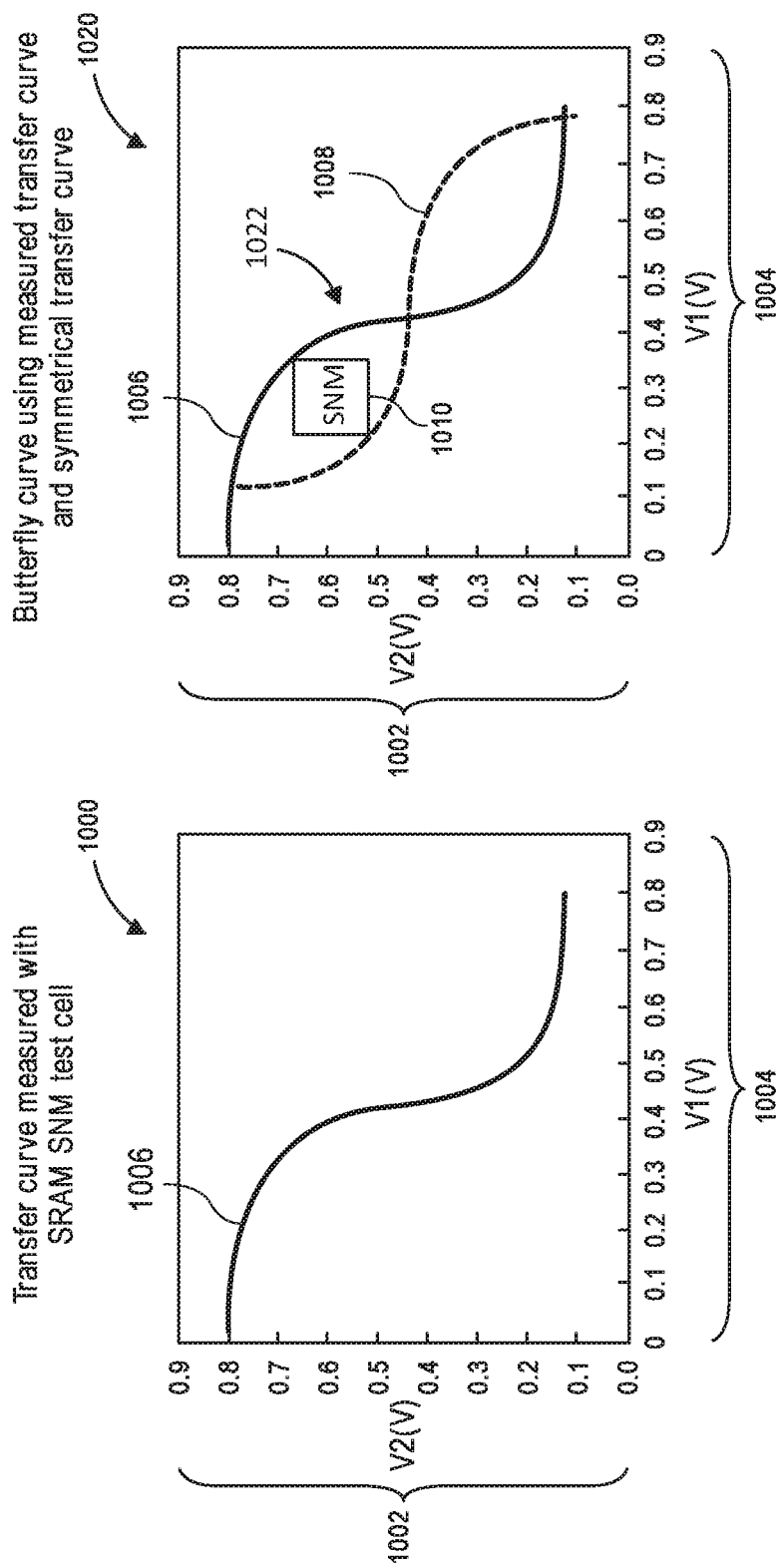
FIG. 10 shows graphs of a transfer curve measured with an SRAM SNM test structure and a butterfly curve using the measured transfer curve and a symmetrical transfer curve, according to examples of the present disclosure.

FIG. 10 is a graph 1000 depicting transfer curve 1006 measured with an SRAM SNM test structure and a graph 1020 depicting a butterfly curve 1022 using the measured transfer curve 1006 and a symmetrical transfer curve 1008, according to examples of the present disclosure. In FIG. 10, the transfer curve 1006 is obtained from a voltage transfer characteristic (VTC) of half of a SRAM cell. In each of graphs 1000 and 1020, the horizontal axis 1004 represents a first voltage and the vertical axis 1002 represents a second voltage. The graph 1020 shows two VTC curves: the measured transfer curve 1006 and the symmetrical transfer curve 1008, which together form the butterfly curve 1022. In the graph 1020, the area 1010 indicates the SNM, where the area 1010 represents the largest square that can be contained between the measured transfer curve 1006 and its symmetrical transfer curve 1008.

In some implementations, the butterfly curve 1022 shown in graph 1020 can be obtained by directly measuring the VTC on each side (left and right side or left and right inverter) of an SRAM cell using a test structure as shown in FIG. 1 (to measure the VTC of the right inverter) and a symmetrical version of the test structure shown in FIG. 1 (to measure the VTC of the left inverter). In FIG. 10, the butterfly curve 1022 is formed by mirroring one side of the VTC with respect to a line passing through the origin at 45 degrees from the horizontal axis 1004. The SNM is given by the length of a diagonal of the area 1010. In the example of FIG. 10, where the measured transfer curve 1006 and the symmetrical transfer curve 1008 are perfectly (or substantially) symmetrical with respect to each other, the area 1010 on the upper part of the butterfly curve 1022 represents the SNM and will fit in the lower part of the butterfly curve 1022.

Figure 11A:
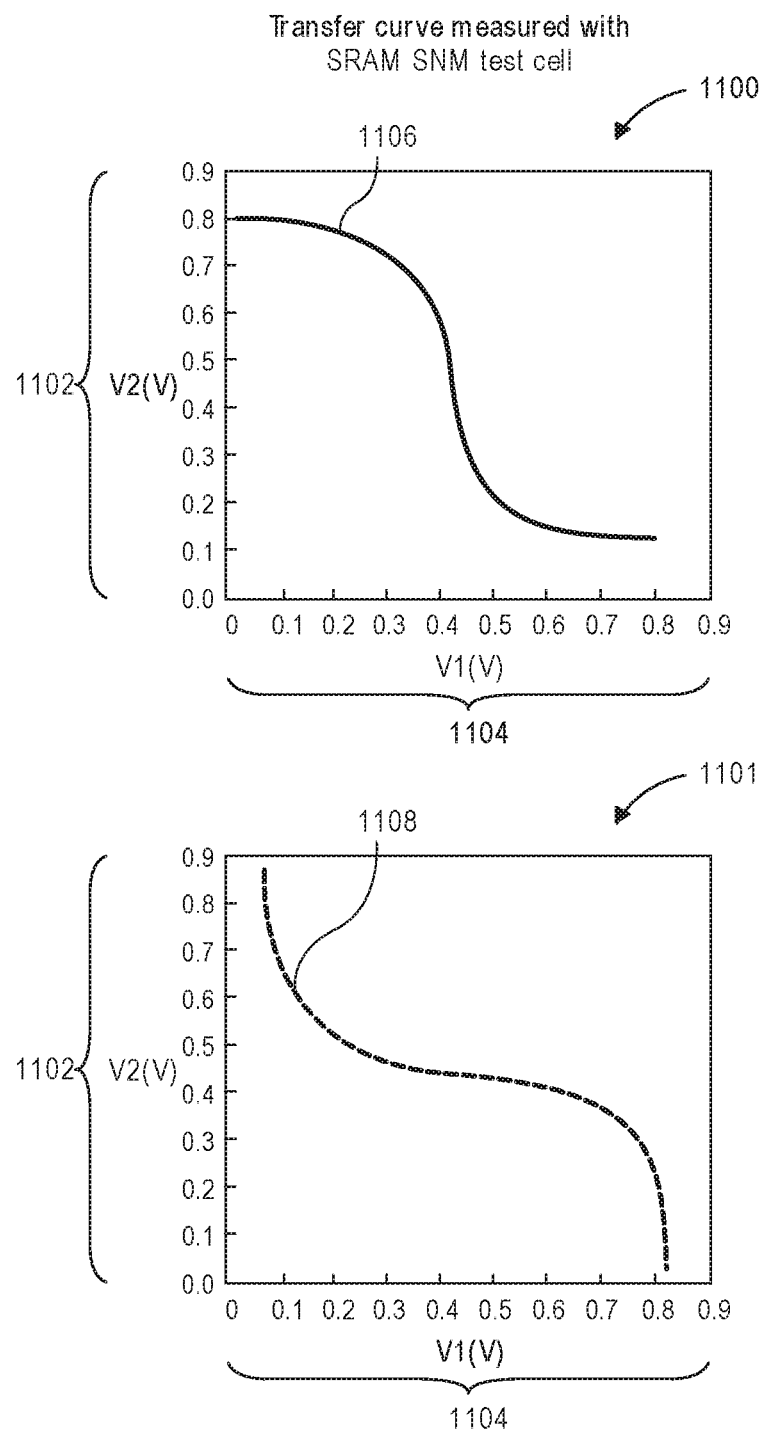
FIG. 11A shows graphs of transfer curves measured with an SRAM SNM test structure, according to examples of the present disclosure.

FIG. 11A shows graphs 1100 and 1101 of transfer curves measured with an SRAM SNM test structure, according to examples of the present disclosure. FIG. 11A shows a graph 1100 of a transfer curve 1106 measured with an SRAM SNM test structure and a graph 1101 of a symmetrical transfer curve 1108. In FIG. 11A, the transfer curve 1106 is obtained from a VTC of half of a SRAM cell. In each of graphs 1100 and 1101, the horizontal axis 1104 represents a first voltage and the vertical axis 1102 represents a second voltage. The graphs 1100 and 1101 depict two VTC curves: the measured transfer curve 1106 and the symmetrical transfer curve 1108, which together form the butterfly curve 1122 shown in FIG. 11B (discussed below).

Figure 11B:
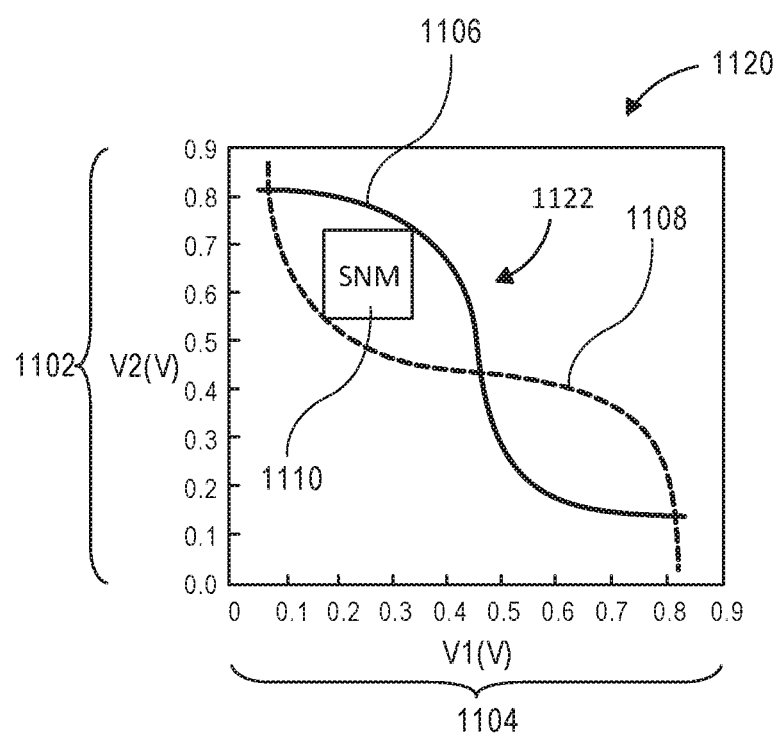
FIG. 11B shows a graph of a butterfly curve using the measured transfer curves of FIG. 11A, according to examples of the present disclosure.

FIG. 11B shows a graph 1120 of a butterfly curve 1122 using the measured transfer curve 1106 and the symmetrical transfer curve 1108 of FIG. 11A, according to examples of the present disclosure. In the graph 1120, the area 1110 indicates the SNM, where the area 1110 represents the largest square that can be contained between the measured transfer curve 1106 and its symmetrical transfer curve 1108. In FIG. 11B, the butterfly curve 1122 is formed by mirroring one side of the VTC with respect to a line passing through the origin at 45 degrees from the horizontal axis 1104. The SNM is given by the length of a diagonal of the area 1110. In the example of FIG. 11B, where the measured transfer curve 1106 and the symmetrical transfer curve 1108 are perfectly (or substantially) symmetrical with respect to each other, the area 1110 on the upper part of the butterfly curve 1122 represents the SNM and will fit in the lower part of the butterfly curve 1122.

Figure 12:
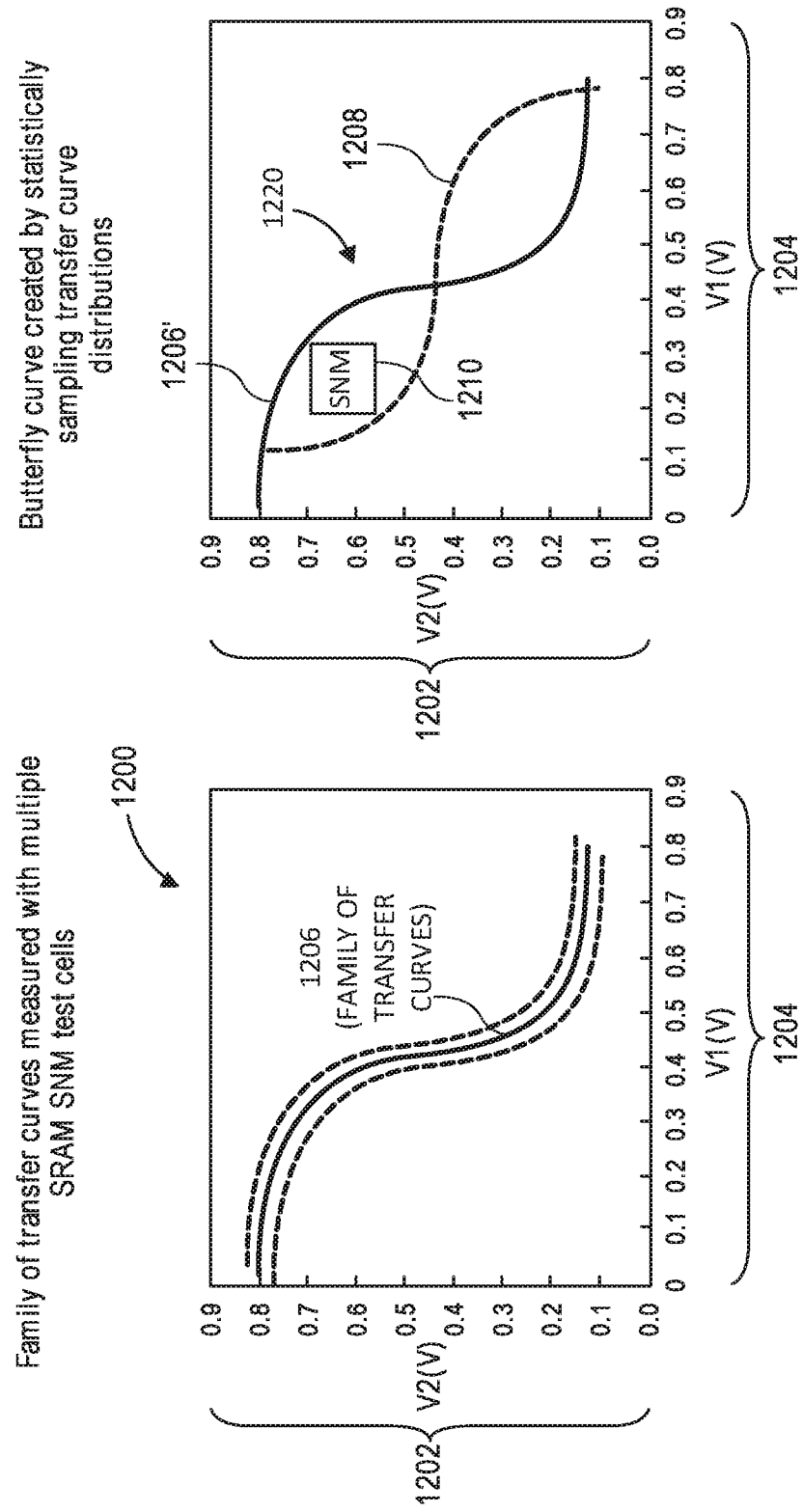
FIG. 12 shows graphs of a family of transfer curves measured with a plurality of SRAM SNM test structures and a butterfly curve created by statistically sampling distributions of the family of transfer curves, according to examples of the present disclosure.

FIG. 12 shows a graph 1200 of a family of voltage transfer curves 1206. Each individual member of the family of transfer curves is provided by measuring an SRAM cell using an SRAM SNM test structure as described above, where a transfer curve is provided for each SRAM cell, thereby providing the family of transfer curves 1206. In other words, a plurality of measurements for a plurality of SRAM cells is measured using a plurality of SRAM SNM test structures to provide the family of transfer curves 1206. The butterfly curve 1220 is then created or derived by statistically sampling and plotting distributions of the family of transfer curves 1206.

In graph 1200, for each voltage transfer curve in the family of curves 1206, the horizontal axis 1204 represents a first voltage and the vertical axis 1202 represents a second voltage. The graph 1200 shows a family of transfer curves 1206 as VTC curves representing measured transfer curves from multiple SRAM SNM test cells. In certain implementations, the family of curves 1206 shown in graph 1200 and the butterfly curve 1220 can be obtained and derived by directly measuring the VTC on each side (left and right side or left and right inverter) of an array of SRAM cells using a test structure as shown in FIG. 2. In FIG. 12, a statistically sampled VTC 1206' of the family of curves 1206 is used with a symmetrical transfer curve 1208, to form the butterfly curve 1220. In the butterfly curve 1220, the area 1210 indicates the SNM, where the area 1210 represents the largest square that can be contained between the statistically sampled VTC 1206' of the family of curves 1206 and its symmetrical transfer curve 1208. In FIG. 12, the butterfly curve 1220 is formed by mirroring one side of the VTC with respect to a line passing through the origin at 45 degrees from the horizontal axis 1204. The SNM for the sampled SRAM cell is given by the length of a diagonal of the area 1210. In other implementations, a statistically sampled VTC 1206' of the family of curves 1206 is used with a second statistically sampled VTC which is formed by mirroring one side of the second VTC with respect to a line passing through the origin at 45 degrees from the horizontal axis 1204. The areas 1210 indicates the SNM, where the area 1210 represents the largest square that can be contained between the statistically sampled VTC 1206' of the family of curves 1206 and the second sampled transfer curve 1208.

Figure 13:
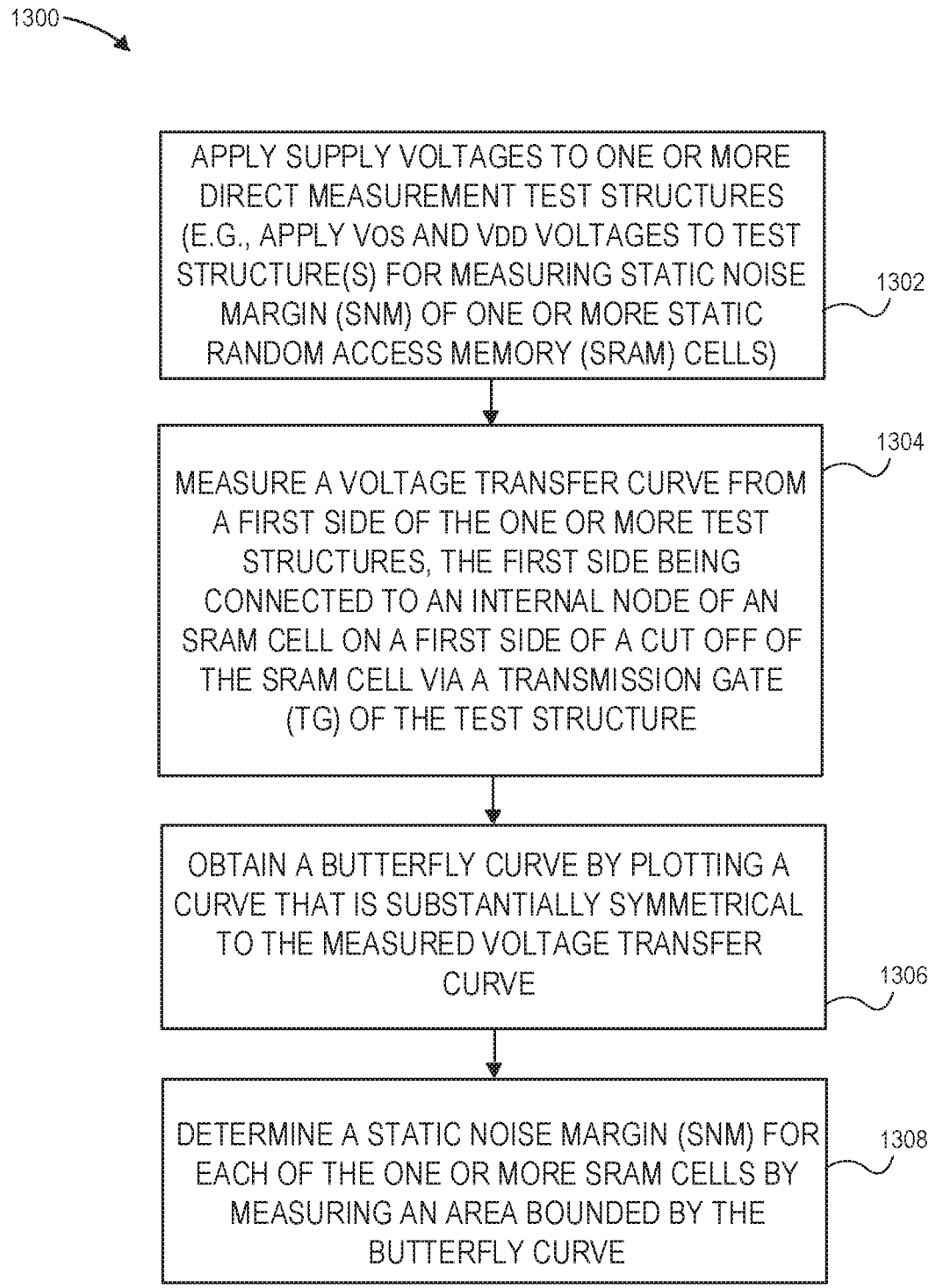
FIG. 13 illustrates a flowchart of a method for using a test structure to directly measure SNM of an SRAM cell, according to an implementation.

FIG. 13 illustrates a flowchart of a method 1300 for using a test structure to directly measure SNM of an SRAM cell, according to an implementation. In various implementations, one or more of the test structures described above with reference to FIGS. 1-9 may be used to perform the method 1300.

At block 1302, the method 1300 begins by applying supply voltages to one or more direct measurement test structures. As shown in FIG. 13, block 1302 may include applying ground ($V_{SS}$) and power ($V_{DD}$) to the one or more direct measurement test structures. As further shown in FIG. 13, the one or more test structures (e.g., a single test structure 100 as in FIG. 1 or an array of test structures as in FIG. 2) are operable to measure SNM of or more SRAM cells.

At block 1304, the method 1300 includes measuring a voltage transfer curve from a first side of each of the one or more test structures. As shown in FIG. 13, the first side of each of the one or more test structures may be connected to an internal node of a respective SRAM cell of the one or more SRAM cells (i.e., an SRAM cell whose SNM is to be measured). As further shown in FIG. 13, the first side of each test structure may also be on a first side of a cut off of the SRAM cell whose SNM is to be measured, where the first side of the cut off is connected to a transmission gate (TG) of a test structure of the or more test structures being used to measure that SRAM cell's voltage transfer curve.

Then, at block 1306, the method 1300 also includes obtaining a butterfly curve by plotting a curve that is substantially symmetrical to the measured voltage transfer curve resulting from completing block 1304.

Next, at block 1308, the method 1300 further includes determining a static noise margin (SNM) for each of the one or more SRAM cells by measuring an area bounded by the butterfly curve resulting from completing block 1306.

The illustrations of direct measurement test structures, transfer curves, and methods in FIGS. 1-13 are not meant to imply physical or architectural limitations to the manner in which an illustrative embodiment may be implemented. Other components in addition to or in place of the ones illustrated may be used. Some components may be optional. Also, the items depicted in FIGS. 1-12 are presented to illustrate some functional components of example test structures for measuring SNM of SRAM cells, and resulting measurements. One or more of these components may be combined, divided, or combined and divided into different components when implemented in an illustrative embodiment.

Notwithstanding that the numerical ranges and parameters setting forth the broad scope of the present teachings are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume negative values, e.g. −1, −2, −3, −10, −20, −30, etc.

While the present teachings have been illustrated with respect to one or more implementations, alterations and/or modifications can be made to the illustrated examples without departing from the spirit and scope of the appended claims. For example, it will be appreciated that while the process is described as a series of acts or events, the present teachings are not limited by the ordering of such acts or events. Some acts may occur in different orders and/or concurrently with other acts or events apart from those described herein. Also, not all process stages may be required to implement a methodology in accordance with one or more aspects or implementations of the present teachings. It will be appreciated that structural components and/or processing stages can be added or existing structural components and/or processing stages can be removed or modified. Further, one or more of the acts depicted herein may be carried out in one or more separate acts and/or phases. Furthermore, to the extent that the terms "including," "includes," "having," "has," "with," or variants thereof are used in either the detailed description and the claims, such terms are intended to be inclusive in a manner similar to the term "comprising." The term "at least one of" is used to mean one or more of the listed items can be selected. As used herein, the term "one or more of" with respect to a listing of items such as, for example, A and B, means A alone, B alone, or A and B. Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "conformal" describes a coating material in which angles of the underlying material are preserved by the conformal material. The term "about" indicates that the value listed may be somewhat altered, as long as the alteration does not result in nonconformance of the process or structure to the illustrated implementation. Finally, "exemplary" indicates the description is used as an example, rather than implying that it is an ideal. Other implementations of the present teachings will be apparent to those skilled in the art from consideration of the specification and practice of the disclosure herein. It is intended that the specification and examples be considered as exemplary only, with a true scope and spirit of the present teachings being indicated by the following claims.

What is claimed is:

1. A test structure for directly measuring a stability of one or more static random access memory (SRAM) cells in an Integrated Circuit (IC) device, the test structure comprising, for each SRAM cell of the one or more SRAM cells:
   a first transmission gate (TG) electrically coupled to a first side of a cut off in the SRAM cell;
   a second TG electrically coupled to a second side of the cut off;
   a first external pin electrically coupled to the first TG and a second external pin electrically coupled to the second TG; and
   a first internal node electrically coupled to the first TG and a second internal node electrically coupled to the second TG, wherein:
   the cut off provides an electrical open between the first side of the cut off and the second side of the cut off; and
   the first internal node is electrically coupled to the first external pin and the second internal node is electrically coupled to the second external pin.

2. The test structure of claim 1, wherein the IC device is fabricated in a complementary metal-oxide-semiconductor (CMOS) process.

3. The test structure of claim 1, wherein the first internal node is electrically coupled to the first external pin through the first TG and the second internal node is electrically coupled to the second external pin through the second TG.

4. The test structure of claim 1, wherein the first TG, the second TG, and the SRAM cell each comprise a same transistor type.

5. The test structure of claim 1, further comprising an array of a plurality of test structures, each of the plurality of test structures addressing a respective one of a plurality of SRAM cells, wherein each of the plurality of test structures are operable to measure static noise margin (SNM) of a respective one of the plurality of SRAM cells.

6. The test structure of claim 1, wherein the one or more SRAM cells include one or more of a 6-cell SRAM cell, a 7-cell SRAM cell, an 8-cell SRAM cell, and a Dual Interlocked Cell (DICE) SRAM cell.

7. The test structure of claim 1, further comprising measurement circuitry, wherein calibration of voltage drop in the measurement circuitry includes:
   using a word line (WL) decoder and column multiplexer peripheral circuitry of the SRAM cell; and
   the measurement circuitry further includes connecting wires that electrically couple the first TG to the second TG.

8. The test structure of claim 1, wherein feedback between the first internal node and the second internal node is broken at the cut off.

9. A method for measuring a stability of a static random access memory (SRAM) cell in an integrated circuit (IC) device, comprising:
   measuring a voltage transfer curve from a first side of a test structure, wherein the first side of the test structure is electrically coupled to a first internal node of the SRAM cell on a first side of a cut off via a first transmission gate (TG);
   obtaining a butterfly curve by plotting a curve that is substantially symmetrical to the measured voltage transfer curve; and
   determining a static noise margin (SNM) for each of the one or more SRAM cells by measuring an area bounded by the butterfly curve, wherein:
   the cut off provides an electrical open between the first side of the cut off and a second side of the cut off; and
   the first internal node is electrically coupled to a first external pin through the first TG; and
   a second internal node at the second side of the cut off is electrically coupled to a second external pin through a second TG.

10. The method of claim 9, wherein the IC device is fabricated in a complementary metal-oxide-semiconductor (CMOS) process.

11. The method of claim 9, further comprising:
   measuring a plurality of SRAM cells using a plurality of SRAM SNM test structures to provide a family of voltage transfer curves;
   statistically sampling distributions of the family of voltage transfer curves;
   deriving a butterfly curve from the statistically sampled distributions of the family of voltage transfer curves; and
   determining a static noise margin (SNM) for the plurality of SRAM cells by measuring an area bounded by the derived butterfly curve.

12. The method of claim 9, further comprising, populating one column of a table of SNM measurements based on measurements obtained from a left side of the cut off of the SRAM cell, and populating another column of the table of SNM measurements based on measurements obtained from a right side of the cut off of the SRAM cell.

13. The method of claim 9, wherein the first TG, the second TG, and the SRAM cell each comprise a same type of transistor.

14. The method of claim 9, further comprising calibrating a voltage drop in measurement circuitry of the test structure, wherein calibrating the voltage drop includes:
   using a word line (WL) decoder and column multiplexer peripheral circuitry of the SRAM cell; and
   forming connecting wires that electrically couple the first TG to the second TG.

15. The method of claim 9, wherein feedback between the first internal node and the second internal node is broken at the cut off.

16. An array of test structures comprising a plurality of test structures for directly measuring a stability of a plurality of static random access memory (SRAM) cells, the array of test structures comprising:
   multiple levels of transmission gates (TGs);
   a first chip analog input/output (IO); and
   a second chip analog IO, wherein:
   a plurality of internal nodes of the plurality of SRAM cells are electrically coupled through the multiple levels of transmission gates (TGs) to one of the first chip analog IO and the second chip analog IO; and
   each test structure of the plurality of test structures is operable to address a respective one of the plurality of SRAM cells, and wherein each test structure of the plurality of test structures are operable to measure static noise margin (SNM) of a respective one of the plurality of SRAM cells.

17. The array of test structures of claim 16, wherein each test structure of the plurality of test structures comprises, for an SRAM cell of the plurality SRAM cells:
   a first transmission gate (TG) electrically coupled to a first side of a cut off in the SRAM cell;
   a second TG electrically coupled to a second side of the cut off; and
   a first external pin electrically coupled to the first TG and a second external pin electrically coupled to the second TG, wherein:
   feedback between the internal nodes of the SRAM cell is broken at the cut off;
   a first internal node of the plurality of internal nodes is electrically coupled to the first external pin through the first TG; and
   a second internal node of the plurality of internal nodes is electrically coupled to the second external pin through the second TG.

18. The array of test structures of claim 16, wherein the plurality of internal nodes of the plurality of SRAM cells include calibration (CAL) cells.

19. The array of test structures of claim 16, wherein the plurality of SRAM cells include 6-cell SRAM cells.

20. The array of test structures of claim 16, wherein the plurality of SRAM cells include 7-cell SRAM cells.

21. The array of test structures of claim 16, wherein the plurality of SRAM cells include 8-cell SRAM cells.

22. The array of test structures of claim 16, wherein the plurality of SRAM cells include Dual Interlocked Cell (DICE) SRAM cells.

* * * * *